(12) United States Patent
Ashayer et al.

(10) Patent No.: US 12,392,686 B2
(45) Date of Patent: Aug. 19, 2025

(54) INSTANTIATING OBJECTS IN A SIMULATED ENVIRONMENT BASED ON LOG DATA

(71) Applicant: Zoox, Inc., Foster City, CA (US)

(72) Inventors: Alireza Ashayer, South San Francisco, CA (US); Ryan Martin Cahoon, Mountain View, CA (US); Rasoul Kabirzadeh, Redwood, CA (US)

(73) Assignee: Zoox, Inc., Foster City, CA (US)

( * ) Notice: Subject to any disclaimer, the term of this patent is extended or adjusted under 35 U.S.C. 154(b) by 769 days.

(21) Appl. No.: 17/193,826

(22) Filed: Mar. 5, 2021

(65) Prior Publication Data

US 2022/0283055 A1 Sep. 8, 2022

(51) Int. Cl.
  *G01M 17/007* (2006.01)
  *B60W 60/00* (2020.01)

(52) U.S. Cl.
  CPC ...... *G01M 17/007* (2013.01); *B60W 60/0011* (2020.02); *B60W 2556/10* (2020.02)

(58) Field of Classification Search
  CPC ........... G01M 17/007; B60W 60/0011; B60W 2556/10; G06F 11/3664; G06F 11/3684; G06F 30/15; G06F 30/20
  See application file for complete search history.

(56) References Cited

U.S. PATENT DOCUMENTS

| | | | |
|---|---|---|---|
| 9,836,895 B1 * | 12/2017 | Nygaard | G07C 5/0841 |
| 10,140,417 B1 * | 11/2018 | Binion | G07C 5/0858 |
| 10,713,148 B2 | 7/2020 | Nygaard et al. | |
| 10,831,202 B1 * | 11/2020 | Askeland | G05D 1/228 |
| 10,852,721 B1 * | 12/2020 | Smith | G05D 1/0022 |
| 2020/0050536 A1 * | 2/2020 | Nygaard | G06F 11/3684 |
| 2020/0065443 A1 | 2/2020 | Liu et al. | |
| 2020/0410062 A1 * | 12/2020 | O'Malley | B60W 60/001 |

(Continued)

FOREIGN PATENT DOCUMENTS

RU     2377658 C1     12/2009

OTHER PUBLICATIONS

International Search Report and Written Opinion for PCT Application No. PCT/US22/16738, mailed Jun. 2, 2022, 10 pages.

(Continued)

*Primary Examiner* — Eunhee Kim
(74) *Attorney, Agent, or Firm* — Lee & Hayes, P.C.

(57) ABSTRACT

Techniques for instantiating objects in a simulated environment based on log data are disclosed herein. Some of the techniques may include receiving log data representing an environment in which a real-world vehicle was operating. Using the log data, a simulated environment for testing a simulated vehicle may be generated. The simulated environment may represent the environment in which the real-world vehicle was operating. The techniques may further include determining a location of the simulated vehicle as it traverses the simulated environment. Based at least in part on the log data, a prior location of the real-world vehicle in the environment closest to the location of the simulated vehicle in the simulated environment may be determined. In this way, the simulated environment may be updated to include a simulated object representing an object in the environment that was perceived by the vehicle from the prior location.

20 Claims, 8 Drawing Sheets

(56) References Cited

U.S. PATENT DOCUMENTS

2020/0410063 A1\* 12/2020 O'Malley ........... G06F 11/3664
2022/0204009 A1\* 6/2022 Choi ................... G06F 11/3696

OTHER PUBLICATIONS

Office Action for U.S. Appl. No. 17/193,826, mailed on Dec. 1, 2023, Ashayer, "Instantiating Objects in a Simulated Environment Based on Log Data", 23 pages.
PCT International Preliminary Report on Patentability mailed Sep. 14, 2023 for PCT Application No. PCT/US22/16738, 8 pages.
Search Report for European Application No. 22763755.0, Dated Dec. 17, 2024, 12 pages.

\* cited by examiner

INSTANTIATING OBJECTS IN A SIMULATED ENVIRONMENT BASED ON LOG DATA

BACKGROUND

Simulated data and simulations can be used to test and validate functionality of vehicle systems, which could be otherwise prohibitive to test in the real-world (e.g., due to safety concerns, limitations on time, repeatability, etc.). However, creating simulations that, both, accurately reflect real-world scenarios and validate functionality of vehicle systems is a difficult challenge. For instance, when simulations are based on data that was previously captured by a vehicle operating in the real-world, the tested vehicle systems undergoing simulation can react differently than the real-world vehicle that captured the data. This can make it difficult to verify that the tested vehicle systems are accurate.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical components or features.

DETAILED DESCRIPTION

Figure 1:
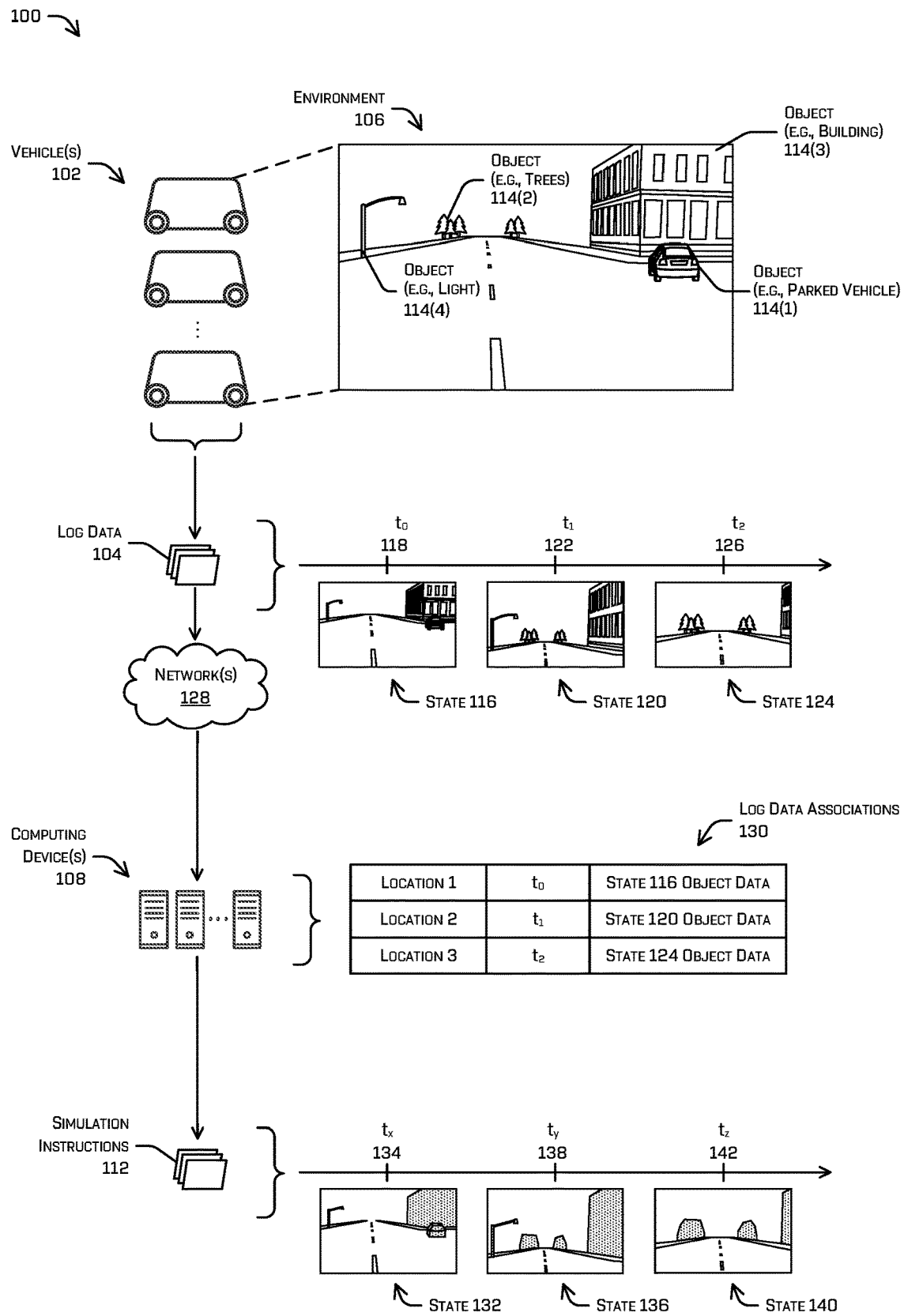
FIG. 1 is a pictorial flow diagram illustrating an example data flow in which vehicle(s) generate log data associated with an environment and transmit the log data to computing device(s) that determine associations between locations of the vehicle(s) and object data captured by the vehicle(s) at different instances in time.

Techniques for instantiating objects in a simulated environment based on log data are disclosed herein. As discussed above, creating simulations that accurately reflect real-world scenarios and validate functionality of vehicle systems is a difficult challenge. For instance, when simulations are based on data that was captured by a vehicle operating in the real-world, the tested vehicle systems undergoing simulation can react differently than the real-world vehicle that captured the data. This can make it difficult to verify whether the tested vehicle systems are accurate. For instance, a simulated vehicle's location can diverge from the path of the vehicle that generated the log, but the perception is still based on the logging vehicle's location. This discrepancy in perception can decrease the accuracy of simulations and even invalidate results in high divergence cases.

Take, for example, a simulated (e.g., test) environment for testing and/or validating an autonomous vehicle controller. The simulated environment may be generated based on log data captured by a real-world vehicle. Accordingly, the simulated environment may correspond with, or otherwise represent, a real-world environment (e.g., the Embarcadero roadway in San Francisco, CA). As such, the real-world environment may include, both, static objects (e.g., buildings, streetlights, traffic signage, benches, parked vehicles, trees, barriers and fences, and the like) that remain stationary for extended periods of time, and dynamic objects (e.g., pedestrians, moving vehicles, cyclists, construction equipment, etc.) that tend to stay in motion. Thus, a simulated environment can include both static objects and dynamic objects to accurately reflect the real-world environment.

With respect to static objects, however, simulating these objects in a simulated environment may present several challenges. For instance, even though they may be classified as static objects, the appearances of these objects can change with time, such as when the vehicle is moving. As another example, a sensor system of a real-world vehicle may, in some instances, mis-detect a static object for an instance of time throughout a period of time. As such, vehicle systems may not always produce a constant, static bounding box output representing a corresponding static object. Instead, vehicle system outputs representing static objects may change, move around, appear, disappear, and/or the like over a given period of time.

Furthermore, as the real-world vehicle moves throughout the environment, the vehicle's systems can be limited to seeing/perceiving only those objects within its horizon. For example, the vehicle's systems may not perceive objects ahead of time before the vehicle is in range of those objects. Accordingly, a simulation representing the real-world vehicle in the real-world environment may present simulated object data to the simulated vehicle to mimic what the real-world vehicle perceives in the real-world at a corresponding location and time of the real-world vehicle. However, when a simulated vehicle deviates from the real-world vehicle (e.g., because of changes to an autonomous controller of the simulated vehicle controller), it may be difficult to present accurate object data to be perceived by the simulated vehicle through the use of real-world vehicle logs.

Accordingly, this disclosure describes techniques for improving simulations based on vehicle logs by determining a closest location of the log vehicle to the current, simulated vehicle's location and instantiating static objects in the simulated environment that the log vehicle would have perceived at that time and/or from that location. For instance, the techniques may include receiving log data representing an environment in which a vehicle (e.g., log vehicle) was operating and generating, based on the log data, a simulated scenario for testing a vehicle controller. In some instances, the simulated scenario may include a simulated environment representing a portion of the environment in which the vehicle was operating. The techniques may also include inputting the simulated scenario into the vehicle controller such that the vehicle controller causes a simulated vehicle to traverse the simulated environment. While running the simulation, a location of the simulated vehicle in the simulated environment may be determined. Accordingly, based on determining the location of the simulated vehicle, the log data may be examined determine a prior location of the vehicle in the environment closest to the location of the simulated vehicle in the simulated environment. Accordingly, the techniques may further include updating the simulated environment to include a simulated object representing an object in the environment that was perceived by the vehicle from the prior location.

The techniques discussed herein can improve the accuracy of simulations for testing and/or validating vehicle controllers. For instance, by determining a closest prior location of a log vehicle to a simulated vehicle's current location and instantiating static objects in the simulated environment that the log vehicle would have perceived from that prior location, the dynamic aspects of static objects may be realistically simulated. Additionally, using the techniques described herein allows for appearances of static objects to change with time, such as when the simulated vehicle is moving (e.g., to simulate how, in a real-world scenario, an appearance of an object can change based on a change in viewpoint). Further, the techniques described herein allow for instantiating static objects in the simulated environment at moments when the log vehicle would have perceived them in the real-world. This can improve simulation testing by providing more accurate data and/or objects the vehicle controller corresponding to what a real-world vehicle would perceive, thus replicating scenarios that are much closer to reality in which the log vehicle does not include such information for a specific time or position of a vehicle in simulation. Other improvements using the disclosed techniques will readily be apparent to those having ordinary skill in the art.

By way of example, and not limitation, a method according to the various techniques disclosed herein may include receiving log data representing an environment in which a vehicle was operating. In some instances, the vehicle may comprise an autonomous vehicle. Additionally, the log data may be associated with a period of time during which the vehicle was operating in the environment. In some examples, the log data may have been generated by a perception system of the vehicle based at least in part on sensor data captured by one or more sensors of the vehicle. In at least one example, the log data includes multiple instances of log data representing the environment in which the vehicle and/or another vehicle were operating during multiple periods of time. In even further examples, the log data may include multiple images representing outputs of a perception system of a real vehicle at various points in time. That is, the log data may include, for instance, a first log data image representing a first perception system output at a first time, a second log data image representing a second perception system output at a second time that is after the first time, a third log data image representing a third perception system output at a third time that is after the second time, and so forth. In some instances, each or the different log data images may include different objects and/or different perspective views of objects as perceived by the real vehicle at that time.

In some examples, the method may include generating, using the log data, a simulated scenario for testing a vehicle controller. The simulated scenario may include a simulated environment representing at least a portion of the environment. The vehicle controller may, in some instances, comprise a controller of an autonomous vehicle. In various examples, the simulated scenario may be input into the vehicle controller such that the vehicle controller causes a simulated vehicle to traverse the simulated environment. In at least one example, the simulated scenario, the simulated environment, simulated objects, and/or the like may be input into the vehicle controller in the form of simulation instructions. That is, the simulation instructions may represent the simulated scenario, the simulated environment, the simulated objects, and/or the like.

In some instances, the method may include determining a location of the simulated vehicle in the simulated environment. For instance, geolocation data may be received from the simulated vehicle based on the simulated vehicle's position within the simulated environment, and the location of the simulated vehicle may be determined based at least in part on the geolocation data.

In examples, the method may additionally or alternatively include determining a prior location of the vehicle in the environment that is associated with the location of the simulated vehicle in the simulated environment. In various examples, determining the prior location may comprise determining a prior location of the vehicle that is closest to the current location of the simulated vehicle. Additionally, or alternatively, based at least in part on determining the prior location, an instance of time at which the vehicle was positioned in the prior location may be determined from the log data. For instance, the log data may include associations between respective, prior locations (e.g., geolocation data) of the vehicle in the environment and respective instances of time (e.g., timestamps) associated with when the vehicle was positioned at those respective, prior locations.

In various examples, object data may be obtained from the log data based at least in part on determining at least one of the prior location and/or the instance of time. The object data may represent one or more objects in the environment that was/were perceived by the vehicle from the prior location and/or at the instance of time. By way of example, and not limitation, for any given instance of time during the period of time in which the vehicle was operating in the environment, the log data may store one or more of a respective timestamp (e.g., indicating the instance of time), respective geolocation data (e.g., indicating the location of the vehicle at that instance of time), and respective object data (e.g., indicating one or more objects perceived by the vehicle at that instance of time and from that location). In some instances, the one or more objects in the environment may comprise static objects and/or dynamic objects. For instance, the one or more objects in the environment may comprise buildings, structures, barriers, fences, obstacles, vehicles, pedestrians, cyclists, benches, streetlights, traffic signage, trees, and/or the like.

In some examples, the method may further include updating the simulated environment to include a simulated object representing the object in the environment. That is, the simulated object may be instantiated within the simulated environment. Additionally, the simulated object may be positioned in the simulated environment at a location that corresponds with where the object is positioned in the real-world environment. In various examples, updating the simulated environment may comprise updating the simulated environment to include multiple simulated objects representing multiple objects in the environment.

In additional, or alternative, examples, the simulated scenario and/or the simulated environment may be updated by presenting the vehicle controller of the simulated vehicle with a different log data image representing the perception system output of the real vehicle when the real vehicle was positioned at a real location in the real environment corresponding closest with the simulated location of the simulated vehicle in the simulated environment. The log data image may include simulated representations of one or more real objects that were perceived by the real vehicle from that real location in the real environment. In this way, as the simulated vehicle moves through the simulated environment, different log data images may be presented to the vehicle controller of the simulated vehicle based on the current simulated location of the simulated vehicle in the simulated environment. Likewise, as the simulated vehicle is stopped in the simulated environment, a same or similar log data image may be presented to the vehicle controller in repetition to simulate that the vehicle is remaining stationary.

In at least one example, the method may include determining that the location of the simulated vehicle has changed. That is, the method may include determining that the simulated autonomous vehicle is positioned in a second location in the simulated environment that is different from the original location. Accordingly, a second prior location of the vehicle in the environment that is associated with the second location of the simulated vehicle may be determined. In various examples, determining the second prior location may comprise determining a second prior location of the vehicle that is closest to the second location of the simulated vehicle. Additionally, or alternatively, based at least in part on determining the second prior location, a second instance of time at which the vehicle was positioned in the second prior location may be determined from the log data. In some instances, second object data may be obtained from the log data based at least in part on determining at least one of the second prior location and/or the second instance of time. Based at least in part on the object data, in some examples the method may include updating at least one of an appearance or position of the simulated object with respect to the simulated vehicle. Additionally, or alternatively, the method may include updating the simulated environment to include another simulated object representing another object in the environment.

In some examples, the method may additionally include controlling the simulated vehicle based at least in part on the simulated object. For instance, a vehicle controller that is being tested may perceive the simulated object in the simulated environment and, based at least in part on perceiving the simulated object, alter a trajectory of the simulated vehicle.

Additionally, in some examples, user-specified objects may be simulated at various locations of the simulated environment. Accordingly, the method may include receiving an input indicating a user-specified location at which a simulated object is to be instantiated within in the simulated environment and updating the simulated environment to include the simulated object at the user-specified location. In even further examples, simulated scenarios may be generated based at least in part on 3-dimensional (3D) simulations, pervious simulations, and the like.

The techniques described herein can be implemented in a number of ways. Example implementations are provided below with reference to the following figures. Although discussed in the context of an autonomous vehicle, the techniques described herein can be applied to a variety of systems requiring control and/or interaction with objects in an environment and is not limited to autonomous vehicles. In another example, the systems, methods, and apparatuses can be used in an aviation or in a nautical context. Additionally, the techniques described herein can be used with real data (e.g., captured using sensor(s)), simulated data (e.g., generated by a simulator), or any combination thereof.

FIG. 1 is a pictorial flow diagram illustrating an example data flow 100 in which vehicle(s) 102 generate log data 104 associated with an environment 106 and transmit the log data to computing device(s) 108 that determine associations 110 between locations of the vehicle(s) 102 and object data captured by the vehicle(s) 102 at different instances in time. Additionally, the computing device(s) 108 may also generate simulation instructions 112 based at least in part on the log data 104. In some examples, the log data 104 can include three-dimensional voxel data, image data, bounding box(es), two dimensional and/or three-dimensional contours of objects, classification data, segmentation data, occlusion data, and the like.

The vehicle(s) 102 may include a computing device having a perception engine and/or a planner component to perform operations such as detecting, identifying, segmenting, classifying, and/or tracking objects from sensor data captured in the environment 106. For example, the computing device associated with vehicle(s) 102 may detect objects 114(1), 114(2), 114(3), and 114(4). While objects 114(1), 114(2), 114(3), and 114(4) are depicted as a parked vehicle, trees, a building, and a streetlight in the environment 106, objects 114(1), 114(2), 114(3), and 114(4) may also include cyclists, pedestrians, animals, road markers, signage, traffic lights, mailboxes, barriers, fences, benches, and/or other objects.

The computing device associated with the vehicle(s) 102 may include one or more processor(s) and memory communicatively coupled to the one or more processor(s). The one or more processor(s) may include, for example, one or more FPGAs, SoCs, ASICs, and/or CPUs. The vehicle(s) 102 may traverse through the environment 106 and determine and/or capture data. For example, the computing device associated with the vehicle(s) 102 may determine vehicle status data, vehicle diagnostic data, vehicle metrics data, and/or map data. In some instances, the vehicle(s) 102 may include one or more sensors where the one or more sensors may include one or more time-of-flight sensors, lidar sensors, radar sensors, sonar sensors, image sensors, audio sensors, infrared sensors, geolocation sensors, wheel encoders, IMUs, etc., or any combination thereof, although other types of sensors are contemplated.

As the vehicle(s) 102 traverse through the environment 106, the sensors may capture sensor data associated with the environment 106. For example, and as discussed above, some of the sensor data may be associated with objects, such as the objects 114(1), 114(2), 114(3), and 114(4). Although objects 114(1), 114(2), 114(3), and 114(4) may represent static objects, in some instances the sensor data may be associated with dynamic objects as well. As used herein, "dynamic objects" may be objects that are associated with a movement (e.g., vehicles, motorcycles, cyclists, pedestrians, animals, etc.) or capable of a movement (e.g., parked vehicles, standing pedestrians, etc.) within the environment 106. In contrast, "static objects" may be objects that are associated with the environment 106 such as, for example, buildings/structures, road surfaces, road markers, signage, barriers, trees, sidewalks, streetlights, parked vehicles, etc. In some instances, the computing device associated with the vehicle(s) 102 may determine information about objects in the environment, such as bounding boxes, classifications, segmentation information, and the like.

The computing device associated with the vehicle(s) 102 may generate log data 104. For example, the log data 104 may include the sensor data, perception data, planning data, vehicle status data, velocity data, intent data, and/or other data generated by the vehicle computing device. In some instances, the sensor data may include data captured by sensors such as time-of-flight sensors, location sensors (e.g., GPS, compass, etc.), inertial sensors (e.g., inertial measurement units (IMUs), accelerometers, magnetometers, gyroscopes, etc.), lidar sensors, radar sensors, sonar sensors, infrared sensors, cameras (e.g., RGB, IR, intensity, depth, etc.), microphone sensors, environmental sensors (e.g., temperature sensors, humidity sensors, light sensors, pressure sensors, etc.), ultrasonic transducers, wheel encoders, etc. The sensor data may be data captured by such sensors such as time-of-flight data, location data, lidar data, radar data, sonar data, image data, audio data, etc. In some instances, the log data 104 may include time data that is associated with the other data generated by the vehicle computing device.

The log data 104 may represent various states of the environment 106 along a timeline. A state, as shown in FIG. 1 may comprise various representations of an environment (a real environment, an environment as represented by captured sensor data, data based on captured sensor data (e.g., bounding boxes, object classifications, planner decisions, and/or an environment as represented by a simulator) at individual time points or over time. For example, the log data 104 may represent a state 116 of the environment 106 at a time $t_0$ 118. In some instances, the state 116 may be an initial state of the environment 106 that is associated with a beginning (or an arbitrary) portion of the log data 104. In some instances, the state 116 may be a state of the environment 106 that is associated with an arbitrary (e.g., middle) portion of the log data 104. The log data 104 may represent a state 120 of the environment 106 at a time $t_1$ 122 that is after the time $t_0$ 118. As depicted in FIG. 1, the log data 104 may further represent a state 124 of the environment 106 at a time $t_2$ 126 that is after the time $t_0$ 118 and $t_1$ 122. For purposes of illustration only, the state 116 may represent the environment 106 at an initial time $t_0$ 118 at 0 seconds, the state 120 may represent the environment 106 at a later time $t_1$ 122 at 5 seconds, and the state 124 may represent the environment 106 at a later time $t_2$ 126 at 15 seconds. Therefore, in some instances, the times $t_0$ 118, $t_1$ 122, and $t_2$ 126 may be nonsequential (e.g., with an elapsed time in between the times $t_0$ 118, $t_1$ 122, and $t_2$ 126) or the times $t_0$ 118, $t_1$ 122, and $t_2$ 126 may be sequential (e.g., without an elapsed time in between the times $t_0$ 118, $t_1$ 122, and $t_2$ 126).

The vehicle(s) 102 may send some or all of the log data 104 to the computing device(s) 108 via one or more network(s) 128. For example, the vehicle(s) 102 may send log data 104 that includes time data, perception data, object data, location data, and/or map data to the computing device(s) 108 to store the log data 104. Such transmission may be wired, wireless, or otherwise, as described in detail herein. Examples of data generated by a vehicle that can be included in the log data 104 can be found, for example, in U.S. patent application Ser. No. 15/644,267 titled "Interactions Between Vehicle and Teleoperations System" and filed Jul. 7, 2017 (describing, in part, communication signals that can include sensor data and data indicating an occurrence of an event as well vehicle control data that can be derived from data received from a sensor and a planner, an object data calculator, an object classifier, a collision predictor system, a kinematics calculator, a safety system actuator, and a control operation of the drive system), U.S. patent application Ser. No. 15/693,700 titled "Occupant Protection System Including Expandable Curtain and/or Expandable Bladder" and filed Sep. 1, 2017 (describing, in part, data representative of a trajectory of the vehicle, location data, object data, and vehicle control data), and U.S. patent application Ser. No. 16/198,653 titled "Executable Component Interface and Controller" filed Nov. 21, 2018 (describing, in part, a type of log data), which are each incorporated by reference in their entirety and for all purposes. In some instances, the computing device(s) 108 may include a server that stores the log data 104 in a database. In some instances, the computing device(s) 108 may operate a scenario generator for generating simulation instructions 112 that define a simulated scenario and/or a simulated environment.

Based on the log data 104, the scenario generator may identify objects (e.g., objects 114(1), 114(2), 114(3), and 114(4)) represented in the log data 104. Then the scenario generator may determine portions of the log data 104 that are associated with the objects. For example, the scenario generator may identify the object 114(3) that is a building in the environment 106 that is represented in the log data 104 at state 116. The scenario generator may identify the object 114(3) that is represented in the log data 104 at states 120 and 124. In some instances, the log data 104 may include perception data associated with the object 114(3) that identifies, for example, an extent of the object 114(3). In some instances, the perception data may include, or may be based on, sensor data from a sensor or a combination of sensors of vehicle(s) 102. In some instances, the log data 104 may include location data associated with the object 114(3) that identifies a location of the object 114(3) in the environment 106.

Using the perception data, the scenario generator may determine one or more log data associations 130 that identify associations between respective locations of the vehicle(s) 102, respective times at which the vehicle(s) 102 were positioned in the respective locations, and respective object data generated by the vehicle(s) 102 when the vehicle(s) 102 were positioned in the respective locations at the respective times. For example, "Location 1" of the log data associations 130 may include first geolocation data (e.g., GPS coordinates) indicating the specific location from which the vehicle(s) 102 perceived the environment 106 as shown in state 116; "Location 2" of the log data associations 130 may include second geolocation data indicating the specific location from which the vehicle(s) 102 perceived the environment 106 as shown in state 120; and "Location 3" of the log data associations 130 may include third geolocation data indicating the specific location from which the vehicle(s) 102 perceived the environment 106 as shown in state 124. Additionally, "$t_0$" of the log data associations 130 may include a first timestamp indicating the specific instance in time at which the vehicle(s) 102 was/were positioned at Location 1; "$t_1$" of the log data associations 130 may include a second timestamp indicating the specific instance in time at which the vehicle(s) 102 was/were positioned at Location 2; and "$t_2$" of the log data associations 130 may include a third timestamp indicating the specific instance in time at which the vehicle(s) 102 was/were positioned at Location 3. Further, the "State 116 Object Data" of the log data associations 130 may include object data representing one or more objects perceived by the vehicle(s) 102 in the environment 106 from Location 1 at time to; the "State 120 Object Data" of the log data associations 130 may include object data representing one or more objects perceived by the vehicle(s) 102 in the environment 106 from Location 2 at time $t_1$; and the "State 124 Object Data" of the log data associations 130 may include object data representing one or more objects perceived by the vehicle(s) 102 in the environment 106 from Location 3 at time $t_2$.

In some instances, the computing device(s) 108 may determine instantiation attributes associated with objects included in the log data 104. Instantiation attributes may indicate a manner in which the vehicle(s) 102 detected the object and/or an initial perception of the object. For purposes of illustration only, the object 114(2) may enter a detection range of the vehicle(s) 102 (e.g., as shown in state 120) by the vehicle(s) 102 approaching the object 114(2) and/or the object 114(2) becoming visible (e.g., the object 114(2) may be behind an occluding object). In some instances, the detection range (also referred to as a perception threshold) may be associated with a capability of the one or more sensors of the vehicle(s) 102. In some instances, the detection range can be associated with a confidence value that is determined by a perception engine of the vehicle(s) 102.

In some instances, the computing device(s) 108 may, additionally or alternatively determine termination attributes associated with objects included in the log data 104. A termination attribute may indicate a manner in which the vehicle(s) 102 may no longer detect the object and/or an updated perception of the object. For purposes of illustration only, the object 114(1) may be in a position outside of the detection range of the vehicle(s) 102 (e.g., as shown in states 120 and 124) by the vehicle(s) 102 moving away from the object 114(1) and/or the object 114(1) becoming occluded.

Based on the log data 104 and/or the log data associations 130, the scenario generator can generate simulation instructions 112 that describe a simulated scenario that includes a simulated environment. For example, the log data 104 may include map data and location data indicating the environment 106 and how the vehicle(s) 102 traversed through the environment 106. Additionally, the log data 104 may include status data of the vehicle(s) 102, including but not limited to acceleration data, steering angle data, indicator status data, etc. as the vehicle(s) 102 traversed through the environment 106. The log data 104 may include time data that associates actions of the vehicle(s) 102 and observations (e.g., sensor data) with a set of timestamps. The log data 104 may be used by the scenario generator to generate the simulation instructions 112 that, when executed, generate simulation data including a simulated environment representing the environment 106 and include simulated objects at various states (e.g., states 116, 120, and 124. For example, the simulation data may represent a state 132 of the simulated environment at a time $t_x$ 134, a state 136 of the simulated environment at a time $t_y$ 138 that is after the time $t_x$ 134, and a state 140 of the simulated environment at a time $t_z$ 142 that is after the time $t_y$ 138.

In some instances, the scenario generator may create simulation instructions 112 that represent the simulated environment that includes more or less detail from environment 106 as depicted in FIG. 1 (e.g., by filtering out objects, by representing objects with bounding boxes, and/or by adding additional objects). In some instances, the scenario generator may input the simulation instructions 112 into a vehicle controller associated with a simulated vehicle to determine how the simulated vehicle responded under the circumstances presented in the simulated scenario.

Figure 2:
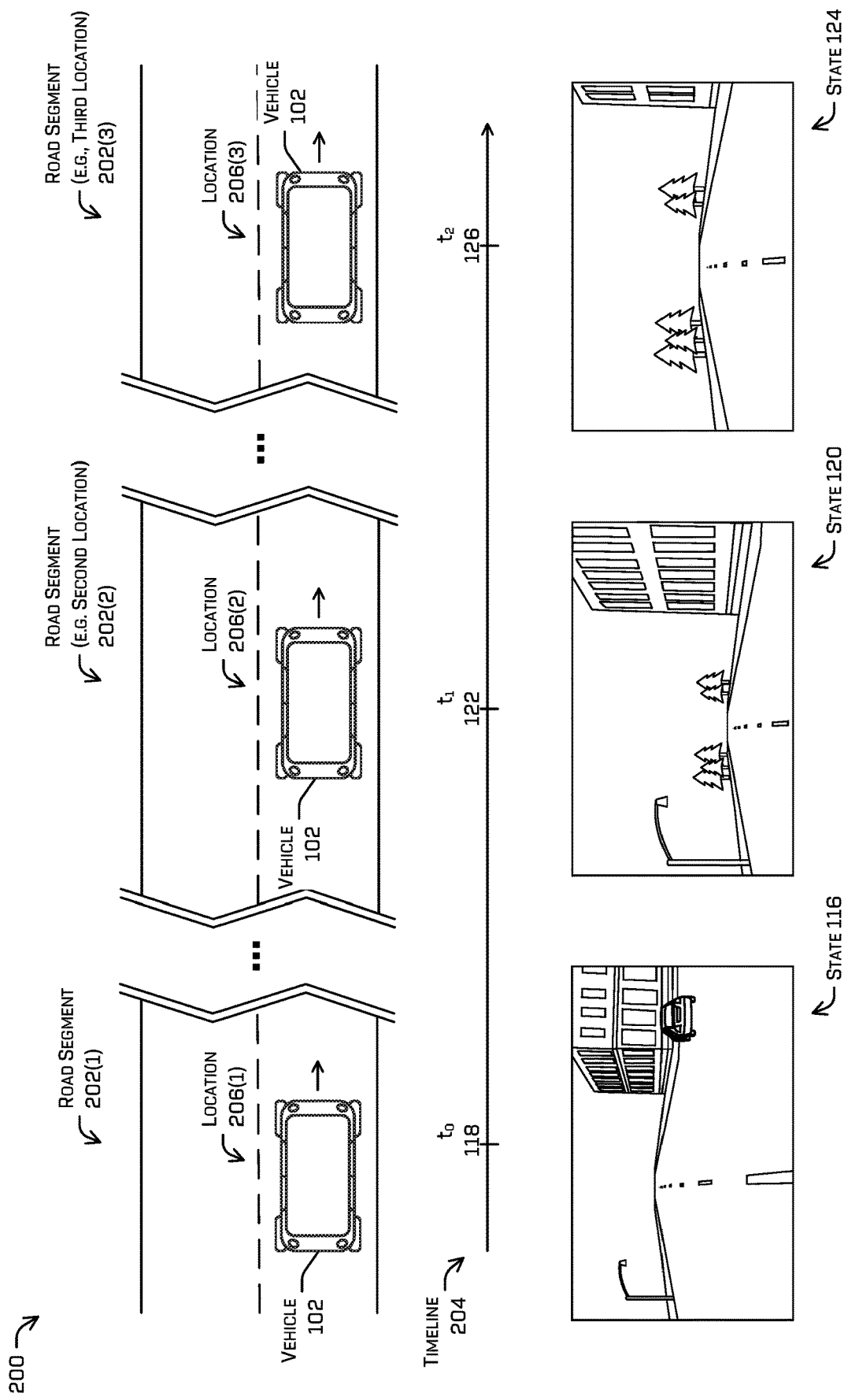
FIG. 2 illustrates an example environment in which a vehicle perceives different objects and different perspectives of the different objects in an environment at different instances of time.

FIG. 2 illustrates an example environment 200 in which a vehicle 102 perceives different objects and different perspectives of the different objects in an environment at different instances of time.

The vehicle 102 may traverse an environment (e.g., environment 106 described above in FIG. 1) according to a network of roads that includes one or more road segments, such as road segments 202(1), 202(2), and 202(3). Each one of the road segments 202(1), 202(2), and 202(3) may be interconnected with each other. That is, in some examples, road segment 202(1) may be connected to road segment 202(2), road segment 202(2) may be connected to road segment 202(3), and so forth. Additionally, or alternatively the road segments 202(1), 202(2), and 202(3) may be connected to each other via other road segments not shown.

The vehicle 102 may traverse the road segments 202(1), 202(2), and 202(3) in first direction as indicated by the timeline 204. For instance, the vehicle 102 may be positioned at a first location 206(1) at a time $t_0$ 118, at a second location 206(2) at a time $t_1$ 122 that is after the time $t_0$ 118, and at a third location 206(3) at a time $t_2$ 126 that is after the time $t_1$ 122. As such, the states 116, 120, and 124 may represent the environment in which the vehicle 102 is operating as perceived by the vehicle 102 from the locations 206(1), 206(2), and 206(3) and at the times $t_0$ 118, $t_1$ 122, and $t_2$ 126, respectively. That is, the states 116, 120, and 124 may represent the environment as perceived by the vehicle 102, a sensor system of the vehicle 102, a perception system of the vehicle 102, a controller of the vehicle 102, etc. For purposes of illustration only, the state 116 may represent the environment 106 at an initial time $t_0$ 118 at 0 seconds, the state 120 may represent the environment 106 at a later time $t_1$ 122 at 5 seconds, and the state 124 may represent the environment 106 at a later time $t_2$ 126 at 15 seconds. Therefore, in some instances, the times $t_0$ 118, $t_1$ 122, and $t_2$ 126 may be nonsequential (e.g., with an elapsed time in between the times $t_0$ 118, $t_1$ 122, and $t_2$ 126) or the times $t_0$ 118, $t_1$ 122, and $t_2$ 126 may be sequential (e.g., without an elapsed time in between the times $t_0$ 118, $t_1$ 122, and $t_2$ 126).

As shown in FIG. 2, the states 116, 120, and 124 may include different objects perceived by the vehicle 102 at the different times $t_0$ 118, $t_1$ 122, and $t_2$ 126 and from the different locations 206(1), 206(2), and 206(3). For instance, at time $t_0$ 118 when the vehicle 102 is at the first location 206(1) the state 116 includes objects such as a parked vehicle, a building, and a streetlight (e.g., objects 114(1), 114(3), and 114(4), respectively, of the environment 106 shown in FIG. 1).

However, when the vehicle 102 moves through the environment to the second location 206(2), the vehicle 102 may perceive the objects as shown in state 120, including the trees, the building, and the streetlight (e.g., objects 114(2), 114(3), and 114(4), respectively, of the environment 106 shown in FIG. 1). Additionally, the appearance of the objects as seen from the perspective of the vehicle 102 may change between states 116 and 120 based on the change of location of the vehicle 102, as well as the disappearance of some objects (e.g., the parked vehicle). Further, objects such as the trees may appear in the state 120 based on the vehicle 102 moving to the second location 206(2), which may be in range of the trees. That is, the sensor system of the vehicle 102 may be in range of the trees shown in state 120 in order to detect the presence of the trees. Finally, when the vehicle 102 moves through the environment to the third location 206(3) at time $t_2$ 126, the vehicle 102 may perceive the objects as shown in state 124.

Figure 3:
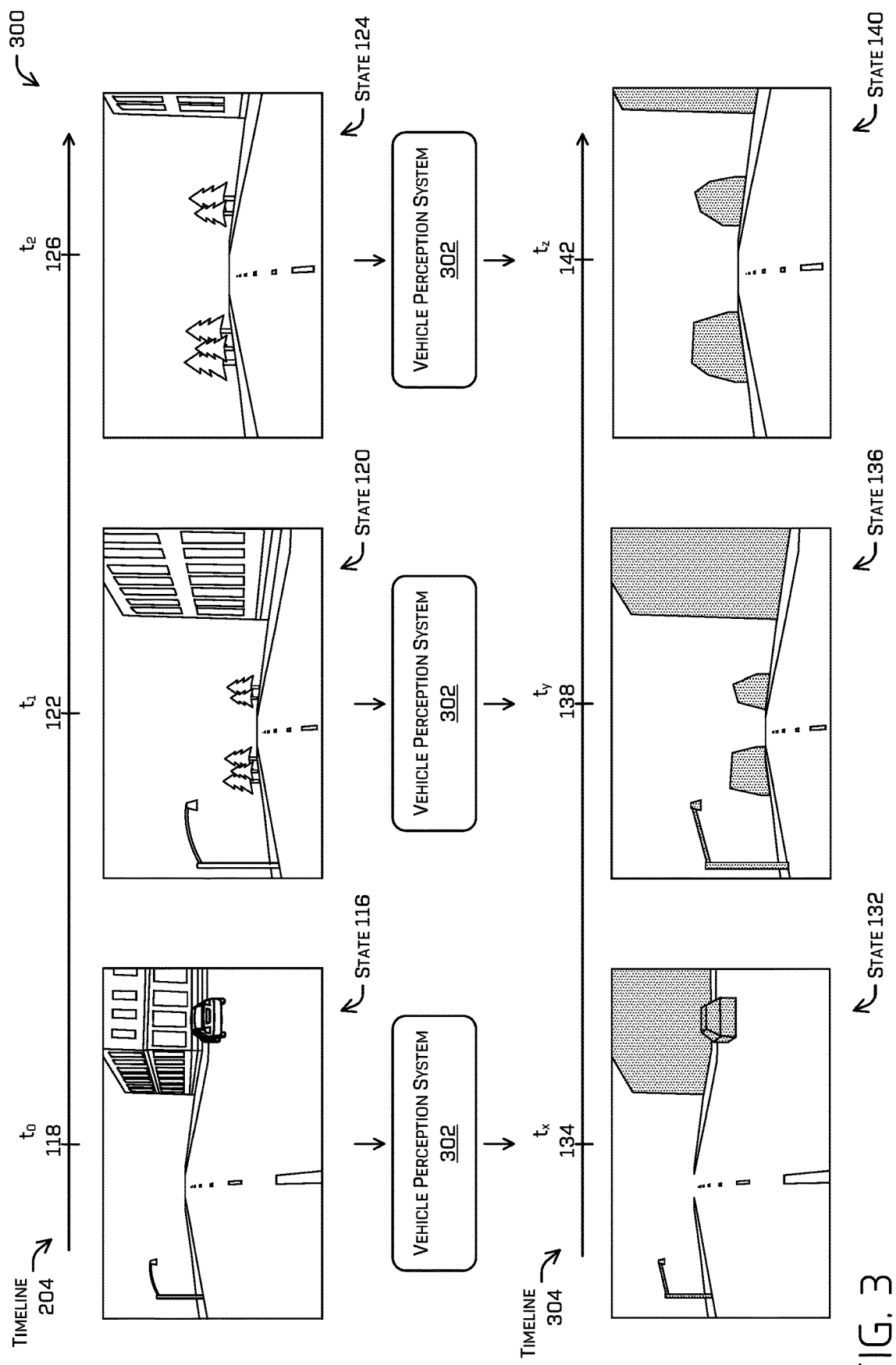
FIG. 3 illustrates an example data conversion that is performed at least partially by a vehicle perception system.

FIG. 3 illustrates an example data conversion 300 that is performed at least partially by a vehicle perception system 302. The vehicle perception system 302 may output different representations of an environment (e.g., environment 106) in which the vehicle (e.g., vehicle 102) is operating based on different perspectives of the environment as perceived by the vehicle from different locations at different instances of time, as described herein.

For instance, the vehicle perception system 302 may receive sensor data captured by a sensor system of the vehicle. The sensor data may include various states representing an environment, such as the states 116, 120, and 124. Each of the states 116, 120, and 124 may represent the environment as seen from a location of the vehicle at a specific time. In examples, the times $t_0$ 118, $t_1$ 122, and $t_2$ 126 of the timeline 204 may be associated with the states 116, 120, and 124, respectively.

By way of example, and not limitation, the vehicle perception system 302 may receive sensor data representing the state 116 of the environment at to 118 and output a simulated representation of the environment shown in state 132. State 132 may include one or more bounding boxes representing the objects seen by the vehicle in state 116. For instance, the vehicle perception system 302 may apply one or more rules, heuristics, transformations, and/or the like to the sensor data in order to output the simulated representation shown in state 132. Additionally, or alternatively, the vehicle perception system 302 may use one or more machine learned models to generate the simulated representation of state 132. The vehicle perception system 302 may perform the same or similar processes with respect to the sensor data representing the states 120 and 124 to generate the simulated representations shown in states 136 and 140. In examples, the log data described herein may include data associated with any one of the states 116, 120, and/or 124, as well as the states 132, 136, and/or 140.

In various examples, the states 132, 136, and 140 may be associated with various times $t_x$ 134, $t_y$ 138, and $t_z$ 142. In this way, a scenario generator may generate simulation instructions that, when executed by a simulator, generate simulation data that represents states 132, 136, and 140 of a simulated environment that are associated with times the $t_x$ 134, $t_y$ 138, and $t_z$ 142. By way of example, and not limitation, when a simulated vehicle is in a same or close-by location as when the vehicle that captured the sensor data shown in state 116 at time $t_0$ 118, the simulated environment perceived by the simulated vehicle may correspond with state 132 at time $t_x$ 134.

Figure 4:
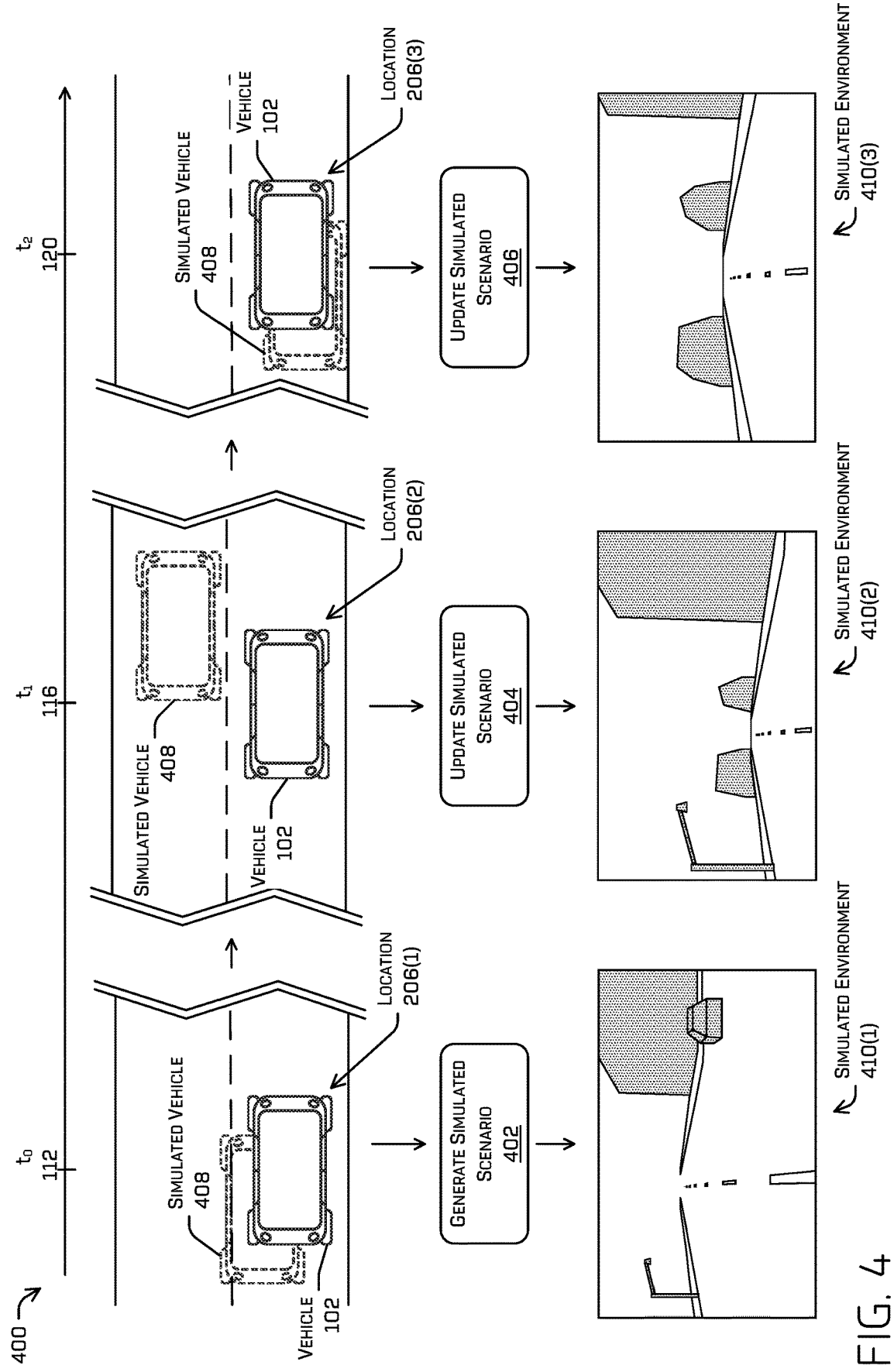
FIG. 4 is a pictorial flow diagram illustrating an example process in which objects are instantiated in a simulated environment based on different locations of a simulated vehicle with respect to various prior locations of a real-world vehicle.

FIG. 4 is a pictorial flow diagram illustrating an example process 400 in which objects are instantiated in a simulated environment based on different locations of a simulated vehicle 408 with respect to various prior locations of the vehicle 102. The vehicle 102 may have captured log data in which the simulated environments 410(1), 410(2), and 410 (3) are based on.

At operation 402, the process 400 includes generating a simulated scenario including a simulated environment 410 (1). The simulated scenario may be generated using log data. In examples, whether the simulated environment 410(1) includes or refrains from including certain simulated objects may be based at least in part on a current location of the simulated vehicle 408 and the prior location 206(1) of the vehicle 102. For instance, because the location of the simulated vehicle 408 is closest to the prior location 206(1) of the vehicle 102, as opposed to the locations 206(2) or 206(3), the simulated environment 410(1) may include the simulated objects shown in FIG. 4 with stippling. In some examples, the one or more simulated objects of the simulated environment 410(1) may represent actual objects that were perceived by the vehicle 102 from the prior location 206(1) at the time $t_0$ 112. That is, the simulated environment 410(1) may include one or more simulated objects representing objects that were in range of a sensor system of the vehicle 102 from the location 206(1) at the time $t_0$ 112.

At operation 404, the process 400 includes updating the simulated scenario to include the simulated environment 410(2) based at least in part on the location of the simulated vehicle 408 moving to be closest to the prior location 206(2) of the vehicle 102 at the time $t_1$ 116. The simulated environment 410(2) includes updated appearances of the objects previously included in the simulated environment 410(1) based at least in part on the simulated vehicle 408 changing locations. Additionally, the simulated environment 410(2) includes additional objects not included in the simulated environment 410(1), as well as fewer object than were included in the simulated environment 410(1), based on the change of location of the simulated vehicle 408. For instance, when the vehicle 102 moved from location 206(1) to location 206(2), additional objects may have become in range or otherwise detectable by the sensor system of the vehicle 102. Similarly, objects that were once detectable by the vehicle 102 may have moved out of range or otherwise became undetectable. Accordingly, the simulated environment 410(2) may be updated to account for these changes that the vehicle 102 would have perceived in the real-world at time $t_1$ 116.

At operation 406, the process 400 includes updating the simulated scenario to include the simulated environment 410(3) based at least in part on the location of the simulated vehicle 408 moving to be closest to the prior location 206(3) of the vehicle 102 at the time $t_2$ 120. The simulated environment 410(3) includes updated appearances of the objects previously included in the simulated environments 410(1) and/or 410(2) based at least in part on the simulated vehicle 408 changing locations. Additionally, the simulated environment 410(3) includes fewer objects than were included in the simulated environments 410(1) and/or 410(2) based on the change of location of the simulated vehicle 408. For instance, when the vehicle 102 moved from location 206(2) to location 206(3), objects that were once detectable by the vehicle 102 may have moved out of range or otherwise became undetectable. Accordingly, the simulated environment 410(3) may be updated to account for these changes that the vehicle 102 would have perceived in the real-world at time $t_2$ 120.

It is to be appreciated that more or less locations (e.g., locations 206(1), 206(2), and 206(3)) may be used than that shown in FIG. 4. For instance, while FIG. 4 includes three locations and three simulated environments, any number of locations and/or simulated environments may be possible to create a realistic simulation.

Figure 5:
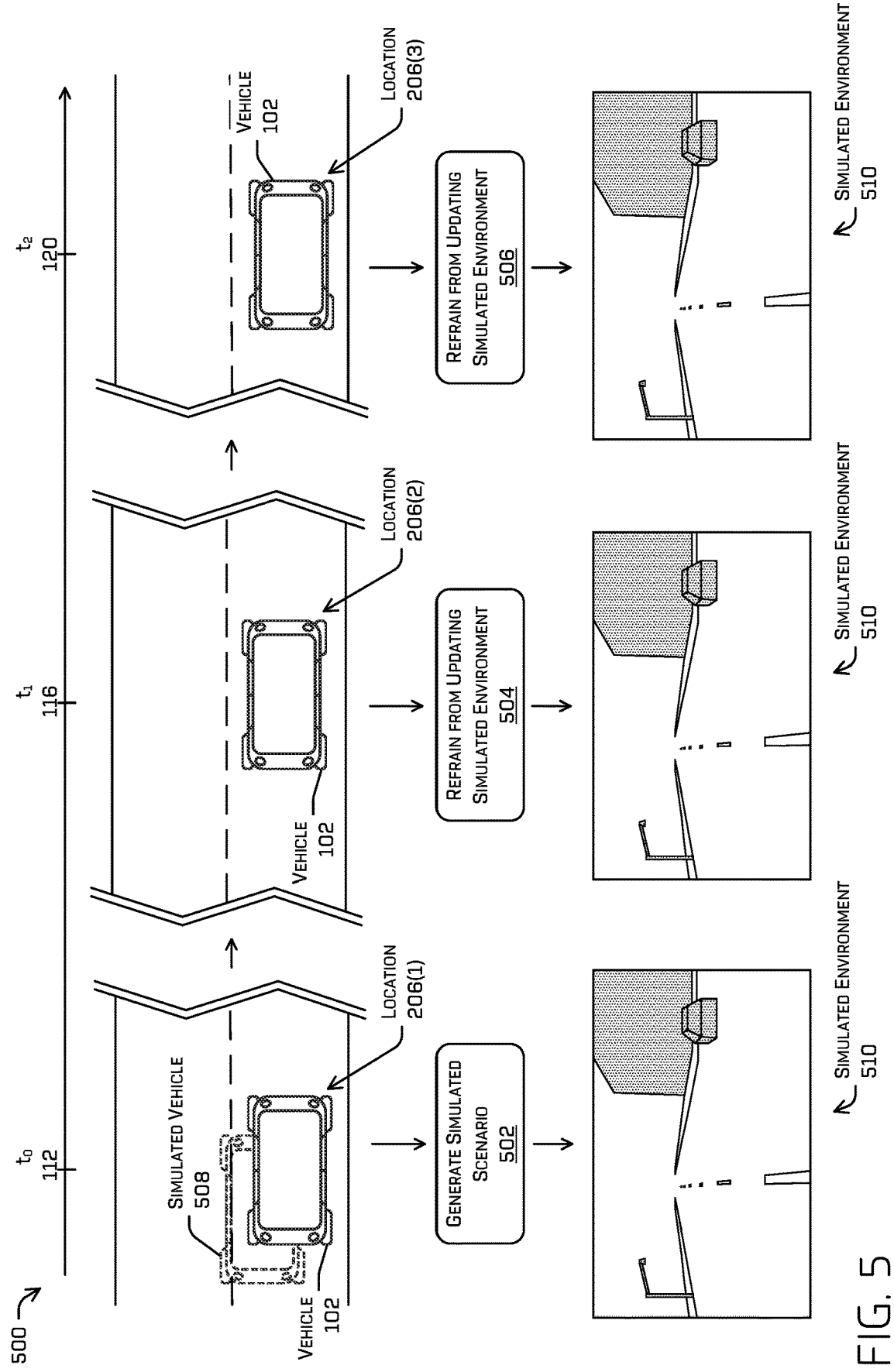
FIG. 5 is a pictorial flow diagram illustrating an example process of refraining from updating a simulated environment based on a simulated vehicle remaining stationary in the simulated environment.

FIG. 5 is a pictorial flow diagram illustrating an example process 500 of refraining from updating a simulated environment based on a simulated vehicle 508 remaining stationary in the simulated environment with respect to a prior location 206(1) of the vehicle 102. The vehicle 102 may have captured log data in which the simulated environment 510 is based on.

At operation 502, the process 500 includes generating a simulated scenario including a simulated environment 510. The simulated scenario may be generated using log data. In examples, whether the simulated environment 510 includes or refrains from including certain simulated objects may be based at least in part on a current location of the simulated vehicle 508 and the prior location 206(1) of the vehicle 102. For instance, because the location of the simulated vehicle 508 is closest to the prior location 206(1) of the vehicle 102, as opposed to the locations 206(2) or 206(3), the simulated environment 510 may include the simulated objects shown in FIG. 5 with stippling. In some examples, the one or more simulated objects of the simulated environment 510 may represent actual objects that were perceived by the vehicle 102 from the prior location 206(1) at the time $t_0$ 112. That is, the simulated environment 510 may include one or more simulated objects representing objects that were in range of a sensor system of the vehicle 102 from the location 206(1) at the time $t_0$ 112.

At operation 504, the process 500 includes refraining from updating the simulated environment 510 of the simulated scenario. Refraining from updating the simulated environment in the operation 504 may be based at least in part on the location of the simulated vehicle 508 remaining stationary. That is, because the simulated vehicle 508 is still closest to the prior location 206(1) of the vehicle 102 at time $t_0$ 112, the simulated environment is not updated to the view from a different location. Thus, instead of updating the simulated environment 510 to correspond with the perspective seen by the vehicle 102 from location 206(2) at time $t_1$ 116, the simulator may re-cycle through the simulated environment 510 such that the environment appears stationary to the simulated vehicle. Similarly, at operation 506 the process 500 includes refraining from updating the simulated environment 510 of the simulated scenario based at least in part on the location of the simulated vehicle 508 remaining stationary.

Figure 6:
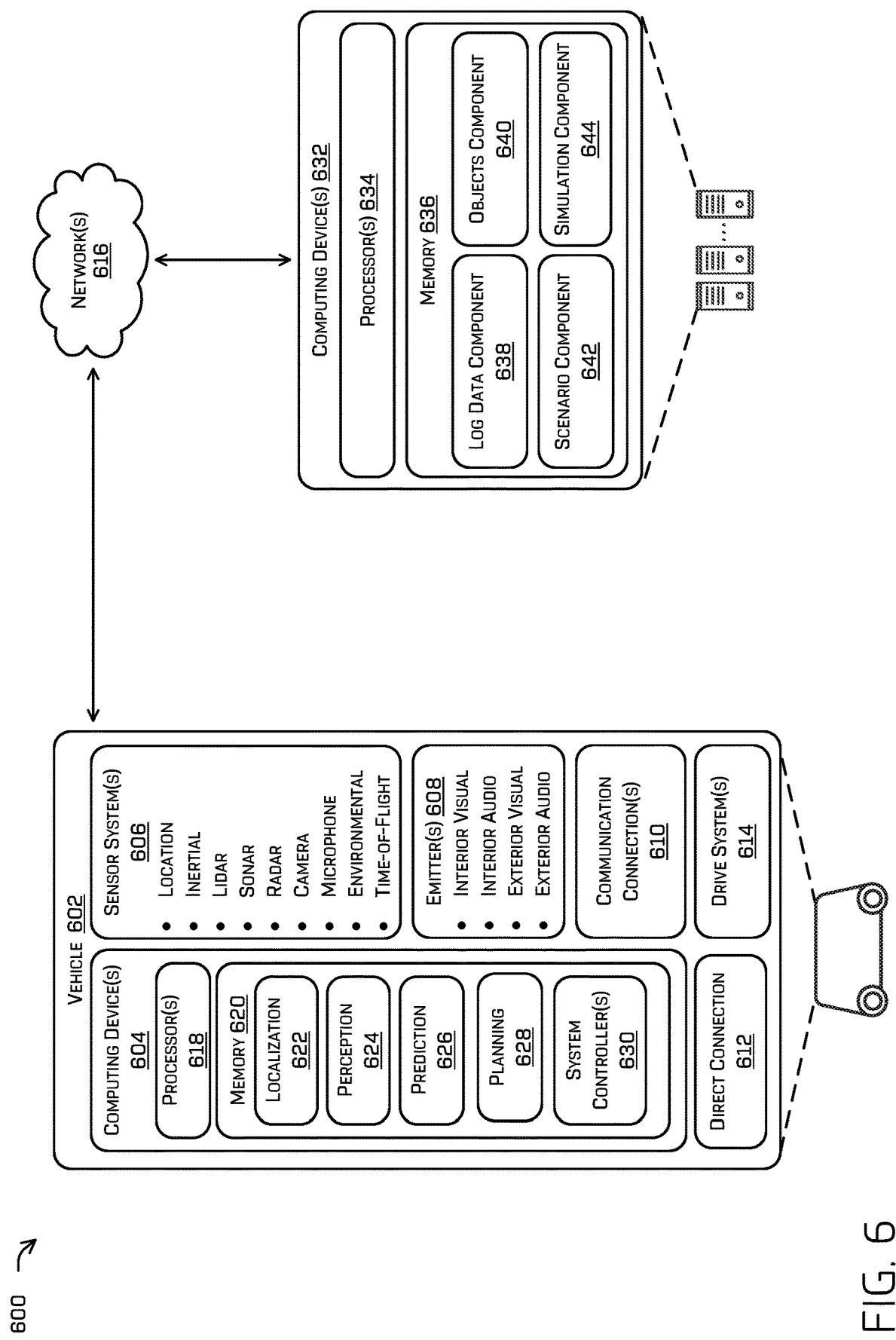
FIG. 6 is a block diagram illustrating an example system for implementing some of the various technologies described herein.

FIG. 6 is a block diagram illustrating an example system 600 for implementing some of the various technologies described herein. In at least one example, the example system 600 may include a vehicle 602, which can be similar to the vehicle(s) 102 described above with reference to FIGS. 1-5. In the illustrated example system 600, the vehicle 602 is an autonomous vehicle; however, the vehicle 602 may be any other type of vehicle.

The vehicle 602 may be a driverless vehicle, such as an autonomous vehicle configured to operate according to a Level 5 classification issued by the U.S. National Highway Traffic Safety Administration, which describes a vehicle capable of performing all safety-critical functions for the entire trip, with the driver (or occupant) not being expected to control the vehicle at any time. In such examples, because the vehicle 602 may be configured to control all functions from start to completion of the trip, including all parking functions, it may not include a driver and/or controls for driving the vehicle 602, such as a steering wheel, an acceleration pedal, and/or a brake pedal. This is merely an example, and the systems and methods described herein may be incorporated into any ground-borne, airborne, or waterborne vehicle, including those ranging from vehicles that need to be manually controlled by a driver at all times, to those that are partially or fully autonomously controlled.

The vehicle 602 may be any configuration of vehicle, such as, for example, a van, a sport utility vehicle, a cross-over vehicle, a truck, a bus, an agricultural vehicle, and/or a construction vehicle. The vehicle 602 may be powered by one or more internal combustion engines, one or more electric motors, hydrogen power, any combination thereof, and/or any other suitable power sources. Although the vehicle 602 has four wheels, the systems and methods described herein may be incorporated into vehicles having fewer or a greater number of wheels, and/or tires. The vehicle 602 may have four-wheel steering and may operate generally with equal or similar performance characteristics in all directions, for example, such that a first end of the vehicle 602 is the front end of the vehicle 602 when traveling in a first direction, and such that the first end becomes the rear end of the vehicle 602 when traveling in the opposite direction. Similarly, a second end of the vehicle 602 is the front end of the vehicle when traveling in the second direction, and such that the second end becomes the rear end of the vehicle 602 when traveling in the opposite direction. These example characteristics may facilitate greater maneuverability, for example, in small spaces or crowded environments, such as parking lots and/or urban areas.

The vehicle 602 may include a computing device(s) 604, one or more sensor system(s) 606, one or more emitter(s) 608, one or more communication connection(s) 610 (also referred to as communication devices and/or modems), at least one direct connection 612 (e.g., for physically coupling with the vehicle 602 to exchange data and/or to provide power), and one or more drive system(s) 614. The one or more sensor system(s) 606 may be configured to capture sensor data associated with an environment.

The sensor system(s) 606 may include time-of-flight sensors, location sensors (e.g., GPS, compass, etc.), inertial sensors (e.g., inertial measurement units (IMUs), accelerometers, magnetometers, gyroscopes, etc.), lidar sensors, radar sensors, sonar sensors, infrared sensors, cameras (e.g., RGB, IR, intensity, depth, etc.), microphone sensors, environmental sensors (e.g., temperature sensors, humidity sensors, light sensors, pressure sensors, etc.), ultrasonic transducers, wheel encoders, etc. The sensor system(s) 606 may include multiple instances of each of these or other types of sensors. For instance, the time-of-flight sensors may include individual time-of-flight sensors located at the corners, front, back, sides, and/or top of the vehicle 602. As another example, the camera sensors may include multiple cameras disposed at various locations about the exterior and/or interior of the vehicle 602. The sensor system(s) 606 may provide input to the computing device(s) 604.

The vehicle 602 may also include one or more emitter(s) 608 for emitting light and/or sound. The one or more emitter(s) 608 in this example include interior audio and visual emitters to communicate with passengers of the vehicle 602. By way of example and not limitation, interior emitters may include speakers, lights, signs, display screens, touch screens, haptic emitters (e.g., vibration and/or force feedback), mechanical actuators (e.g., seatbelt tensioners, seat positioners, headrest positioners, etc.), and the like. The one or more emitter(s) 608 in this example also include exterior emitters. By way of example and not limitation, the exterior emitters in this example include lights to signal a direction of travel or other indicator of vehicle action (e.g., indicator lights, signs, light arrays, etc.), and one or more audio emitters (e.g., speakers, speaker arrays, horns, etc.) to audibly communicate with pedestrians or other nearby vehicles, one or more of which may comprise acoustic beam steering technology.

The vehicle 602 may also include one or more communication connection(s) 610 that enable communication between the vehicle 602 and one or more other local or remote computing device(s) (e.g., a remote teleoperations computing device) or remote services. For instance, the communication connection(s) 610 may facilitate communication with other local computing device(s) on the vehicle 602 and/or the drive system(s) 614. Also, the communication connection(s) 610 may allow the vehicle 602 to communicate with other nearby computing device(s) (e.g., other nearby vehicles, traffic signals, etc.).

The communications connection(s) 610 may include physical and/or logical interfaces for connecting the computing device(s) 604 to another computing device or one or more external networks 616 (e.g., the Internet). For example, the communications connection(s) 610 may enable Wi-Fi-based communication such as via frequencies defined by the IEEE 802.11 standards, short range wireless frequencies such as Bluetooth, cellular communication (e.g., 2G, 3G, 4G, 4G LTE, 5G, etc.), satellite communication, dedicated short-range communications (DSRC), or any suitable wired or wireless communications protocol that enables the respective computing device to interface with the other computing device(s).

In at least one example, the vehicle 602 may include one or more drive system(s) 614. In some examples, the vehicle 602 may have a single drive system 614. In at least one example, if the vehicle 602 has multiple drive systems 614, individual drive systems 614 may be positioned on opposite ends of the vehicle 602 (e.g., the front and the rear, etc.). In at least one example, the drive system(s) 614 may include one or more sensor system(s) 606 to detect conditions of the drive system(s) 614 and/or the surroundings of the vehicle 602. By way of example and not limitation, the sensor system(s) 606 may include one or more wheel encoders (e.g., rotary encoders) to sense rotation of the wheels of the drive systems, inertial sensors (e.g., inertial measurement units, accelerometers, gyroscopes, magnetometers, etc.) to measure orientation and acceleration of the drive system, cameras or other image sensors, ultrasonic sensors to acoustically detect objects in the surroundings of the drive system, lidar sensors, radar sensors, etc. Some sensors, such as the wheel encoders may be unique to the drive system(s) 614. In some cases, the sensor system(s) 606 on the drive system(s) 614 may overlap or supplement corresponding systems of the vehicle 602 (e.g., sensor system(s) 606).

The drive system(s) 614 may include many of the vehicle systems, including a high voltage battery, a motor to propel the vehicle, an inverter to convert direct current from the battery into alternating current for use by other vehicle systems, a steering system including a steering motor and steering rack (which may be electric), a braking system including hydraulic or electric actuators, a suspension system including hydraulic and/or pneumatic components, a stability control system for distributing brake forces to mitigate loss of traction and maintain control, an HVAC system, lighting (e.g., lighting such as head/tail lights to illuminate an exterior surrounding of the vehicle), and one or more other systems (e.g., cooling system, safety systems, onboard charging system, other electrical components such as a DC/DC converter, a high voltage junction, a high voltage cable, charging system, charge port, etc.). Additionally, the drive system(s) 614 may include a drive system controller which may receive and preprocess data from the sensor system(s) 606 and to control operation of the various vehicle systems. In some examples, the drive system controller may include one or more processor(s) and memory communicatively coupled with the one or more processor(s). The memory may store one or more modules to perform various functionalities of the drive system(s) 614. Furthermore, the drive system(s) 614 also include one or more communication connection(s) that enable communication by the respective drive system with one or more other local or remote computing device(s).

The computing device(s) 604 may be similar to the vehicle computing device described above with reference to FIG. 1. The computing device(s) 604 may include one or more processor(s) 618 and memory 620 communicatively coupled with the one or more processor(s) 618. In the illustrated example, the memory 620 of the computing device(s) 604 stores a localization component 622, a perception component 624, a prediction component 626, a planning component 628, and one or more system controller (s) 630. Though depicted as residing in the memory 620 for illustrative purposes, it is contemplated that the localization component 622, the perception component 624, the prediction component 626, the planning component 628, and the one or more system controller(s) 630 may additionally, or alternatively, be accessible to the computing device(s) 604 (e.g., stored in a different component of vehicle 602 and/or be accessible to the vehicle 602 (e.g., stored remotely).

In the memory 620 of the computing device(s) 604, the localization component 622 may include functionality to receive data from the sensor system(s) 606 to determine a position of the vehicle 602. For example, the localization component 622 may include and/or request/receive a three-dimensional map of an environment and may continuously determine a location of the autonomous vehicle within the map. In some instances, the localization component 622 may use SLAM (simultaneous localization and mapping) or CLAMS (calibration, localization and mapping, simultaneously) to receive time-of-flight data, image data, lidar data, radar data, sonar data, IMU data, GPS data, wheel encoder data, or any combination thereof, and the like to accurately determine a location of the autonomous vehicle. In some instances, the localization component 622 may provide data to various components of the vehicle 602 to determine an initial position of an autonomous vehicle for generating a trajectory, as discussed herein. In at least one example, the localization component 622 may determine a location of a simulated vehicle within a simulated environment and/or determine a closest prior location of a vehicle that recorded log data of which the simulated environment is based on.

The perception component 624 may include functionality to perform object detection, segmentation, and/or classification. In some examples, the perception component 624 may provide processed sensor data that indicates a presence of an entity that is proximate to the vehicle 602 and/or a classification of the entity as an entity type (e.g., car, pedestrian, cyclist, building, tree, road surface, curb, sidewalk, unknown, etc.). In additional and/or alternative examples, the perception component 624 may provide processed sensor data that indicates one or more characteristics associated with a detected entity and/or the environment in which the entity is positioned. In some examples, characteristics associated with an entity may include, but are not limited to, an x-position (global position), a y-position (global position), a z-position (global position), an orientation, an entity type (e.g., a classification), a velocity of the entity, an extent of the entity (size), etc. Characteristics associated with the environment may include, but are not limited to, a presence of another entity in the environment, a state of another entity in the environment, a time of day, a day of a week, a season, a weather condition, an indication of darkness/light, etc. In at least one example, the perception component 624 may generate log data associated with a vehicle traversing an environment, as described herein. The log data may then be used to, among other things, generate a simulated scenario including a simulated environment for testing a vehicle.

The perception component 624 may include functionality to store perception data generated by the perception component 624. In some instances, the perception component 624 may determine a track corresponding to an object that has been classified as an object type. For purposes of illustration only, the perception component 624, using sensor system(s) 606 may capture one or more images of an environment. The sensor system(s) 606 may capture images of an environment that includes an object, such as a building, vehicle, trees, streetlights, pedestrians, etc.

The stored perception data may, in some examples, include fused perception data captured by the vehicle. Fused perception data may include a fusion or other combination of sensor data from sensor system(s) 606, such as image sensors, lidar sensors, radar sensors, time-of-flight sensors, sonar sensors, global positioning system sensors, internal sensors, and/or any combination of these. The stored perception data may additionally or alternatively include classification data including semantic classifications of objects (e.g., pedestrians, vehicles, buildings, road surfaces, etc.) represented in the sensor data.

The prediction component 626 may generate one or more probability maps representing prediction probabilities of possible locations of one or more objects in an environment. For example, the prediction component 626 may generate one or more probability maps for vehicles, pedestrians, animals, and the like within a threshold distance from the vehicle 602. In some instances, the prediction component 626 may measure a track of an object and generate a discretized prediction probability map, a heat map, a probability distribution, a discretized probability distribution, and/or a trajectory for the object based on observed and predicted behavior. In some instances, the one or more probability maps may represent an intent of the one or more objects in the environment.

The planning component 628 may determine a path for the vehicle 602 to follow to traverse through an environment. For example, the planning component 628 may determine various routes and paths and various levels of detail. In some instances, the planning component 628 may determine a route to travel from a first location (e.g., a current location) to a second location (e.g., a target location). For the purpose of this discussion, a route may be a sequence of waypoints for traveling between two locations. As non-limiting examples, waypoints include streets, intersections, global positioning system (GPS) coordinates, etc. Further, the planning component 628 may generate an instruction for guiding the autonomous vehicle along at least a portion of the route from the first location to the second location. In at least one example, the planning component 628 may determine how to guide the autonomous vehicle from a first waypoint in the sequence of waypoints to a second waypoint in the sequence of waypoints. In some examples, the instruction may be a path, or a portion of a path. In some examples, multiple paths may be substantially simultaneously generated (i.e., within technical tolerances) in accordance with a receding horizon technique. A single path of the multiple paths in a receding data horizon having the highest confidence level may be selected to operate the vehicle.

In other examples, the planning component 628 may alternatively, or additionally, use data from the perception component 624 to determine a path for the vehicle 602 to follow to traverse through an environment. For example, the planning component 628 may receive data from the perception component 624 regarding objects associated with an environment. Using this data, the planning component 628 may determine a route to travel from a first location (e.g., a current location) to a second location (e.g., a target location) to avoid objects in an environment. In at least some examples, such a planning component 628 may determine there is no such collision free path and, in turn, provide a path which brings vehicle 602 to a safe stop avoiding all collisions and/or otherwise mitigating damage.

In at least one example, the computing device(s) 604 may include one or more system controller(s) 630, which may be configured to control steering, propulsion, braking, safety, emitters, communication, and other systems of the vehicle 602. These system controller(s) 630 may communicate with and/or control corresponding systems of the drive system(s) 614 and/or other components of the vehicle 602, which may be configured to operate in accordance with a path provided from the planning component 628.

The vehicle 602 may connect to computing device(s) 632 via network(s) 616 and may include one or more processor(s) 634 and memory 636 communicatively coupled with the one or more processor(s) 634. In at least one instance, the one or more processor(s) 634 may be similar to the processor(s) 618 and the memory 636 may be similar to the memory 620. In the illustrated example, the memory 636 of the computing device(s) 632 stores a log data component 638, an objects component 640, a scenario component 642, and a simulation component 644. Though depicted as residing in the memory 636 for illustrative purposes, it is contemplated that the log data component 638, the objects component 640, the scenario component 642, and the simulation component 644 may additionally, or alternatively, be accessible to the computing device(s) 632 (e.g., stored in a different component of computing device(s) 632 and/or be accessible to the computing device(s) 632 (e.g., stored remotely).

In the memory 636 of the computing device(s) 632, the log data component 638 may determine log data to be used for generating a simulated scenario. As discussed above, a database may store one or more log data. In some instances, the computing device(s) 632 may act as the database to store the log data. In some instances, the computing device(s) 632 may connect to a different computing device to access the log data database. The log data component 638 may scan log data stored in the database and identify log data that contains an event of interest. As discussed above, in some instances, the log data may include an event marker that indicates that an event of interest is associated with a particular log data. In some instances, a user may select a log data of a set of log data to be used to generate a simulated scenario.

Additionally, the objects component 640 may identify one or more objects associated with the log data. For example, the objects component 640 may determine objects such as vehicles, pedestrians, animals, cyclists, trees, buildings, streetlights, barriers, fences, etc. in the log data and represented as simulated objects. In some instances, the objects component 640 may determine objects that interact with the vehicle associated with the log data. In some examples, the objects component 640 may determine attributes associated with an object. For example, an attribute may include an object extent (also referred to as an object size, which may represent a length, width, height, and/or volume), an object classification, an object pose, an object trajectory, an object waypoint, an object instantiation attribute, and/or an object termination attribute.

An object extent may indicate a size and/or volume of the object (e.g., a length of 5 meters). The object classification may indicate a classification and/or type of the object (e.g., a vehicle, a pedestrian, a bicyclist, etc.). The object pose may indicate an object's x-y-z coordinates (e.g., a position or position data) in the environment and/or may include a pitch, a roll, and/or a yaw associated with the object. The object trajectory may indicate a trajectory followed by the object. The object waypoint may indicate a position in the environment that indicates a route between two locations.

The object instantiation attribute may indicate how the vehicle detected the object. For example, the object may enter a detection range of the vehicle by: (1) the vehicle approaching the object, (2) the object approaching the vehicle, and/or (3) the object becoming visible (unoccluded) or an occlusion cessation of the object. The object termination attribute may indicate how the vehicle may no longer detect the object. For example, the object may be in a position outside of the detection range of the vehicle by: (1) the vehicle moving away from the object, (2) the object moving away from the vehicle, and/or (3) the object becoming occluded or an occlusion of the object.

The scenario component 642 may use the log data identified by the log data component 638 to generate a simulated scenario. The simulated scenario may include a simulated environment (e.g., roadways, road markers, buildings, etc.) and simulated objects (e.g., other vehicles, buildings, trees, streetlights, barriers, fences, pedestrians, cyclists, animals, etc.). In some instances, the scenario component 642 may use the perception data generated by the perception component 624 to apply simulated object models to the simulated objects. For example, the scenario component 642 may identify a simulated vehicle model and apply it to the simulated objects associated with vehicles. In some instances, the scenario component 642 may identify a simulated building model and apply it to the simulated objects associated with buildings.

By way of example and not limitation, the log data may include objects of varying sizes such as mailboxes, trees, buildings, and/or the like. The scenario component 642 may use a volume-based filter such that objects that are associated with a volume greater equal to or greater than a threshold volume of three cubic meters, such as buildings, are represented in the simulated scenario and objects that are associated with a volume less than three cubic meters are not represented in the simulated scenario, such as the mailboxes. In some instances, the scenario component 642 may use a motion-based filter such that objects associated with motion or a trajectory according to the log data are either one of represented in or removed from the simulated scenario. In some instances, the filters may be applied in combination or mutually exclusively.

In some instances, the scenario component 642 may filter objects that do not meet or exceed a confidence threshold. By way of example and without limitation, the log data may indicate that an object is associated with a classification attribute of a pedestrian and a confidence value of associated with the classification of 5%. The scenario component 642 may have a confidence value threshold of 75% and filter the object based on the confidence value not meeting or exceeding the confidence value threshold. In some instances, a user may provide a user-generated filter that includes one or more attribute thresholds such that the scenario component 642 may filter objects that do not meet or exceed the one or more attribute thresholds indicated by the user-generated filter.

The simulation component 644 may execute the simulated scenario as a set of simulation instructions and generate simulation data. In some instances, the simulation component 644 may execute multiple simulated scenarios simultaneously and/or in parallel. This may allow a user to edit a simulated scenario and execute permutations of the simulated scenario with variations between each simulated scenario. The simulation component 644, in at least one example, tests a vehicle controller by simulating a scenario.

Additionally, the simulation component 644 may determine an outcome for the simulated scenario. For example, the simulation component 644 may execute the scenario for use in a simulation for testing and validation. The simulation component 644 generate the simulation data indicating how the autonomous controller performed (e.g., responded) and may compare the simulation data to a predetermined outcome and/or determine if any predetermined rules/assertions were broken/triggered.

In some instances, the predetermined rules/assertions may be based on the simulated scenario (e.g., traffic rules regarding crosswalks may be enabled based on a crosswalk scenario or traffic rules regarding crossing a lane marker may be disabled for a stalled vehicle scenario). In some instances, the simulation component 644 may enable and disable rules/assertions dynamically as the simulation progresses. For example, as a simulated object approaches a school zone, rules/assertions related to school zones may be enabled and disabled as the simulated object departs from the school zone. In some instances, the rules/assertions may include comfort metrics that relate to, for example, how quickly an object may accelerate given the simulated scenario.

Based at least in part on determining that the autonomous controller performed consistent with the predetermined outcome (that is, the autonomous controller did everything it was supposed to do) and/or determining that a rule was not broken or an assertion was not triggered, the simulation component 644 may determine that the autonomous controller succeeded. Based at least in part on determining that the autonomous controller performance was inconsistent with the predetermined outcome (that is, the autonomous controller did something that it wasn't supposed to do) and/or determining that a rule was broken or than an assertion was triggered, the simulation component 644 may determine that the autonomous controller failed. Accordingly, based at least in part on executing the simulated scenario, simulation data may indicate how the autonomous controller responds to each simulated scenario, as described above and determine a successful outcome or an unsuccessful outcome based at least in part on the simulation data.

The processor(s) 618 of the computing device(s) 604 and the processor(s) 634 of the computing device(s) 632 may be any suitable processor capable of executing instructions to process data and perform operations as described herein. By way of example and not limitation, the processor(s) 618 and 634 may comprise one or more Central Processing Units (CPUs), Graphics Processing Units (GPUs), or any other device or portion of a device that processes electronic data to transform that electronic data into other electronic data that may be stored in registers and/or memory. In some examples, integrated circuits (e.g., ASICs, etc.), gate arrays (e.g., FPGAs, etc.), and other hardware devices may also be considered processors in so far as they are configured to implement encoded instructions.

The memory 620 computing device(s) 604 and the memory 636 of the computing device(s) 632 are examples of non-transitory computer-readable media. The memory 620 and 636 may store an operating system and one or more software applications, instructions, programs, and/or data to implement the methods described herein and the functions attributed to the various systems. In various implementations, the memory 620 and 636 may be implemented using any suitable memory technology, such as static random-access memory (SRAM), synchronous dynamic RAM (SDRAM), nonvolatile/Flash-type memory, or any other type of memory capable of storing information. The architectures, systems, and individual elements described herein may include many other logical, programmatic, and physical components, of which those shown in the accompanying figures are merely examples that are related to the discussion herein.

In some instances, aspects of some or all of the components discussed herein may include any models, algorithms, and/or machine learning algorithms. For example, in some instances, the components in the memory 620 and 636 may be implemented as a neural network.

Figure 7:
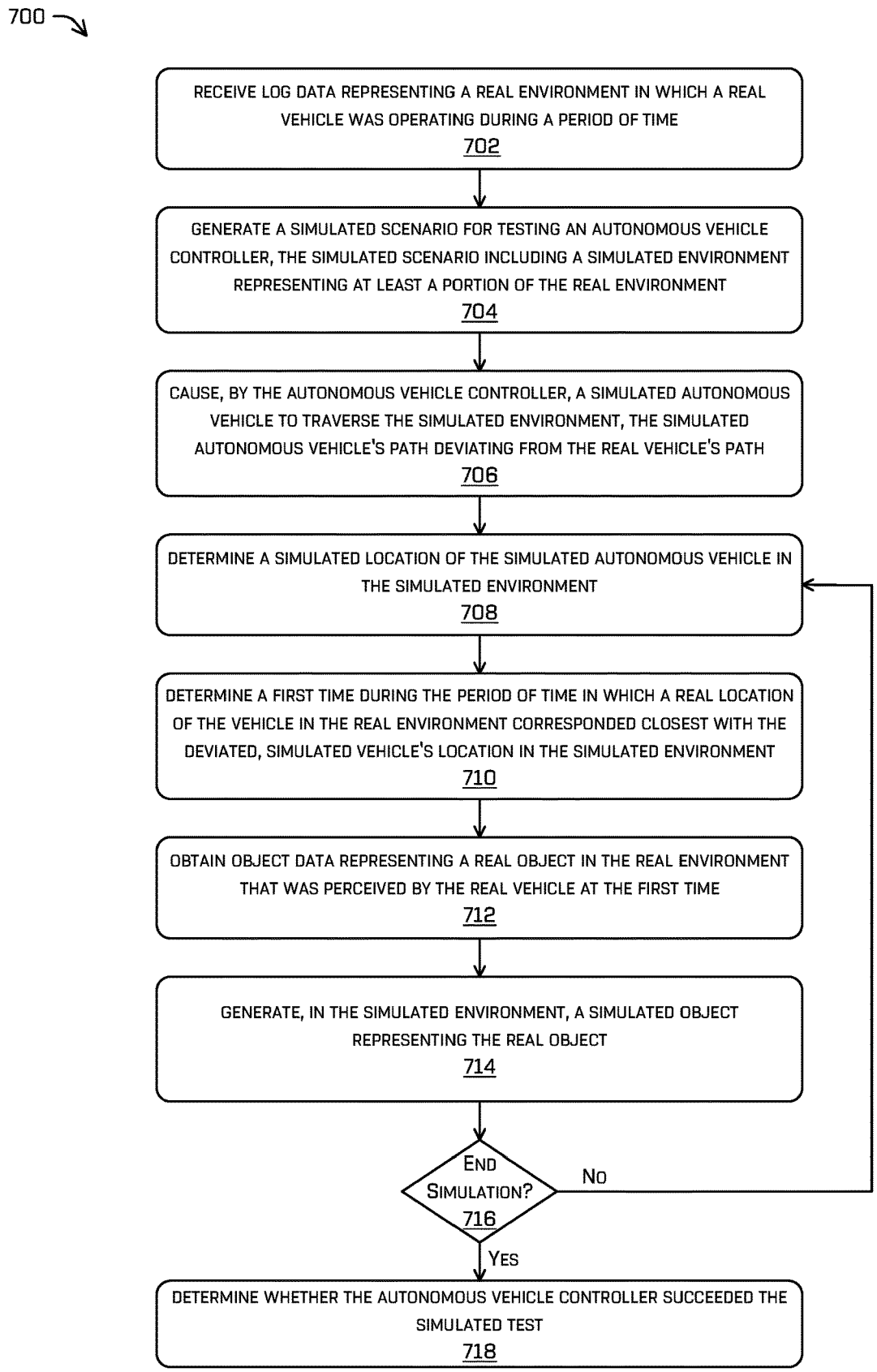
FIG. 7 is a flowchart illustrating an example method for updating a simulated environment to include objects based on a location of a simulated vehicle with respect to a prior location of a real-world vehicle.
Figure 8:
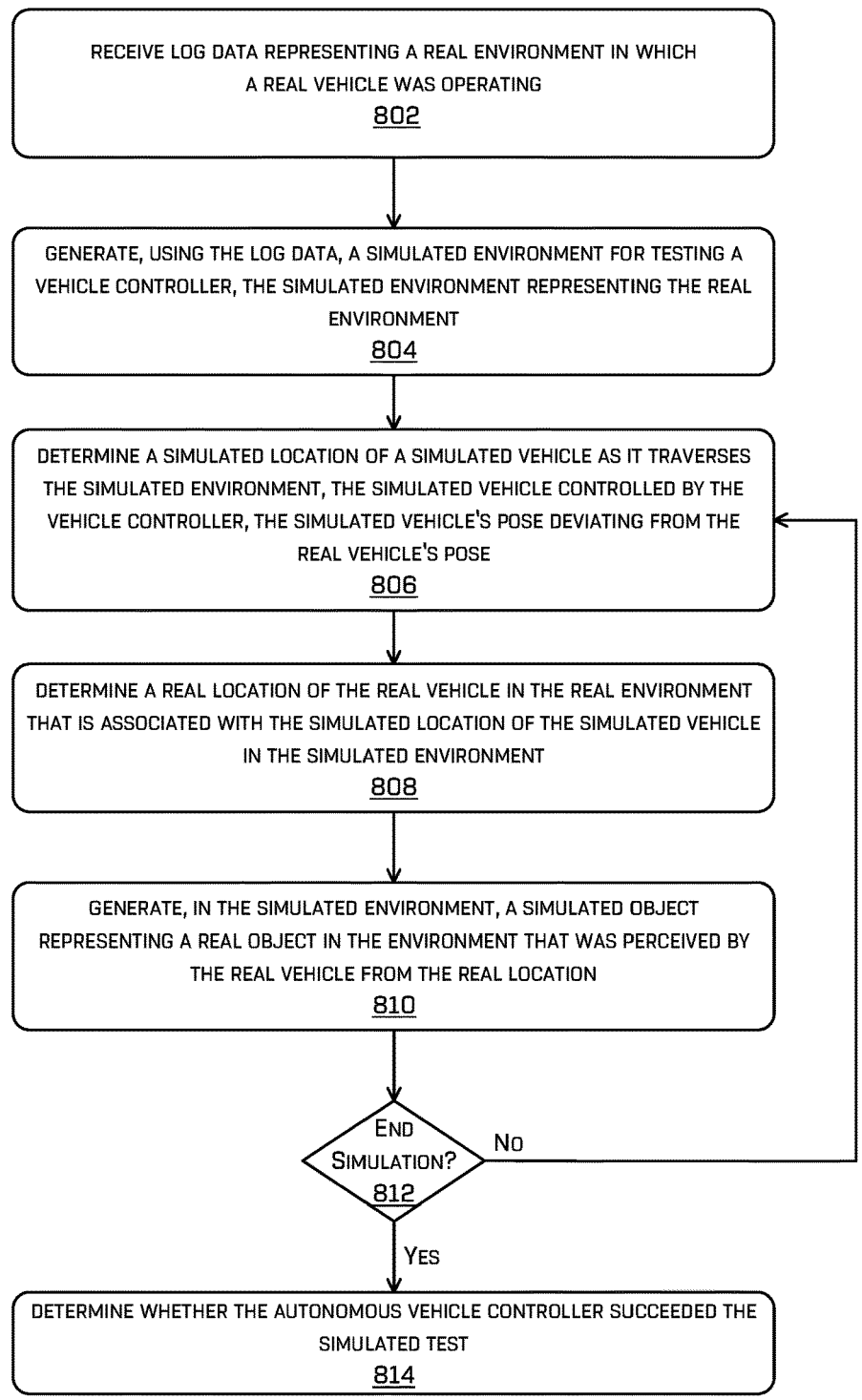
FIG. 8 is a flowchart illustrating another example method for updating a simulated environment to include objects based on a location of a simulated vehicle with respect to a prior location of a real-world vehicle.

FIGS. 7 and 8 are flowcharts showing example methods of instantiating objects in a simulated environment based on log data. The methods illustrated in FIGS. 7 and 8 are described with reference to one or more of the vehicles and/or systems described in FIGS. 1-6 for convenience and ease of understanding. However, the methods illustrated in FIGS. 7 and 8 are not limited to being performed using the vehicles, systems, and/or techniques described in FIGS. 1-6, and may be implemented using any of the other vehicles, systems, and technologies described in this application, as well as vehicles, systems, and technologies other than those described herein. Moreover, the vehicles, systems, and user interfaces described herein are not limited to performing the methods illustrated in FIGS. 7 and 8.

The methods 700 and 800 are illustrated as collections of blocks in logical flow graphs, which represent sequences of operations that can be implemented in hardware, software, or a combination thereof. In the context of software, the blocks represent computer-executable instructions stored on one or more computer-readable storage media that, when executed by one or more processors, perform the recited operations. Generally, computer-executable instructions include routines, programs, objects, components, data structures, and the like that perform particular functions or implement particular abstract data types. The order in which the operations are described is not intended to be construed as a limitation, and any number of the described blocks can be combined in any order and/or in parallel to implement the processes. In some embodiments, one or more blocks of the process may be omitted entirely. Moreover, the methods 700 and 800 may be combined in whole or in part with each other or with other methods.

FIG. 7 is a flowchart illustrating an example method 700 for updating a simulated environment to include objects based on a location of a simulated vehicle with respect to a prior location of a real-world vehicle.

The method 700 begins at operation 702, which includes receiving log data representing a real environment in which a real vehicle was operating during a period of time. For instance, the computing device(s) 108 may receive the log data over one or more networks 128 from one or more vehicles 102. In some examples, the log data may have been generated by a perception system of the vehicle based at least in part on sensor data captured by one or more sensors of the vehicle. In at least one example, the log data includes multiple instances of log data representing the environment in which the vehicle and/or another vehicle were operating during multiple periods of time.

At operation 704, the method 700 includes generating, using the log data, a simulated scenario for testing an autonomous vehicle controller, the simulated scenario including a simulated environment representing at least a portion of the real environment. For instance, the computing device(s) 108 may generate the simulated scenario including a simulated environment representing a portion of the environment 106.

At operation 706, the method 700 includes causing, by the autonomous vehicle controller, a simulated autonomous vehicle to traverse the simulated environment. In various examples, a simulated path of the simulated autonomous vehicle in/through the simulated environment may deviate from a real path of the real vehicle in/through the real environment. In at least one example, the simulated scenario, the simulated environment, simulated objects, and/or the like may be input into the autonomous vehicle controller in the form of simulation instructions. That is, the simulation instructions may represent the simulated scenario, the simulated environment, the simulated objects, and/or the like.

At operation 708, the method 700 includes determining a simulated location of the simulated autonomous vehicle in the simulated environment. For instance, the computing device(s) 108 may receive geolocation data from the simulated vehicle based on the simulated vehicle's position within the simulated environment, and the simulated location of the simulated vehicle may be determined based at least in part on the geolocation data. At operation 710, the method 700 includes determining, based at least in part on the log data, a first time during the period of time in which a real location of the real vehicle in the real environment corresponded closest to the simulated location of the simulated autonomous vehicle in the simulated environment. For instance, the computing device(s) 108 may determine a first time (e.g., to 112) in which the prior location 206(1) of the vehicle 102 was closest to the location of the simulated vehicle 508. Additionally, or alternatively, the computing device(s) 108 may determine the first time based at least in part on the log data associations 130.

At operation 712, the method 700 includes obtaining, from the log data, object data representing a real object in the real environment that was perceived by the real vehicle at the first time. For instance, the computing device(s) 108 may obtain object data from the log data associations 130 based at least in part on which prior location of the vehicle 102 that the simulated vehicle is closest to. At operation 716, the method 700 includes generating, in the simulated environment, a simulated object representing the real object such that the simulated vehicle perceives the simulated object. For instance, the computing device(s) 108 may instantiate the simulated object within the simulated environment at the location in which the vehicle 102 perceived the object. In some examples, whether or not the simulated object is generated in the simulated environment may be based at least in part on determining a classification of the real object. That is, if the real object is a dynamic object, then the simulated object may not be generated. However, if the real object is a static object, then the simulated object may be generated and/or instantiated within the simulated environment.

At operation 716, the method 700 includes determining whether or not to end the simulation. For instance, if the simulation is at the end of the log data file of which the simulation is based on, then the computing device(s) 108 may determine to end the simulation and proceed to operation 718. However, if the simulation is not yet at the end of the log data file, or if the simulation is to be continued, then the method 700 may loop back to operation 708. In this way, operations 708-716 may continue until the end of a simulation is reached so that the simulated environment will continue to be updated based on the simulated location of the simulated vehicle. At operation 718, if the simulation is to be terminated, the method 700 may include determining whether the autonomous vehicle controller succeeded the simulated test. For instance, the computing device(s) 108 may determine whether the simulated vehicle of the simulation traversed the simulated environment safely, effectively, etc.

FIG. 8 is a flowchart illustrating another example method 800 for updating a simulated environment to include objects based on a location of a simulated vehicle with respect to a prior location of a real-world vehicle.

The method 800 may begin at operation 802, which includes receiving log data representing a real environment in which a real vehicle was operating. For instance, the computing device(s) 108 may receive the log data over one or more networks 128 from one or more vehicles 102. In some examples, the log data may have been generated by a perception system of the real vehicle based at least in part on sensor data captured by one or more sensors of the real vehicle. In at least one example, the log data includes multiple instances of log data representing the environment in which the real vehicle and/or another real vehicle were operating during multiple periods of time.

At operation 804, the method 800 may include generating, using the log data, a simulated environment for testing a vehicle controller, the simulated environment representing the real environment. For instance, the computing device(s) 108 may generate simulation instructions 112 that include the simulated environment. At operation 806, the method 800 may include determining a simulated location of the simulated vehicle as it traverses the simulated environment. The simulated vehicle may be controlled by the vehicle controller. Additionally, in some examples, a simulated pose of the simulated vehicle in the simulated environment may deviate from a real pose of the real vehicle in the real environment (e.g., the simulated vehicle may be oriented on a heading of 90 degrees from North, while the real vehicle is oriented on a heading of 93 degrees from the North). In some examples, the computing device(s) 108 may receive geolocation data from the simulated vehicle based on the simulated vehicle's position within the simulated environment, and the simulated location of the simulated vehicle may be determined based at least in part on the geolocation data.

At operation 808, the method 800 may include determining, based at least in part on the log data, a real location of the real vehicle in the real environment that is associated with the simulated location of the simulated vehicle in the simulated environment. For instance, the computing device(s) 108 may determine the real location of the real vehicle. Additionally, the computing device(s) 108 may determine the real location of the real vehicle based at least in part on receiving geolocation data associated with the simulated location of the simulated vehicle in the simulated environment.

At operation 810, the method 800 may include generating, in the simulated environment, a simulated object representing a real object in the real environment that was perceived by the real vehicle from the real location. For instance, the computing device(s) 108 may instantiate the simulated object at a simulated location in the simulated environment that corresponds with the real-world location of the real object in the real environment.

At operation 812, the method 800 may include determining whether or not to end the simulation. For instance, if the simulation is at the end of the log data file of which the simulation is based on, then the computing device(s) 108 may determine to end the simulation and proceed to operation 814. However, if the simulation is not yet at the end of the log data file, or if the simulation is to be continued, then the method 800 may loop back to operation 806. In this way, operations 806-812 may continue until the end of a simulation is reached so that the simulated environment will continue to be updated based on the simulated location of the simulated vehicle. At operation 814, if the simulation is to be terminated, the method 800 may include determining whether the simulated vehicle succeeded the simulated test. For instance, the computing device(s) 108 may determine whether the simulated vehicle of the simulation traversed the simulated environment safely, effectively, etc.

Example Clauses

A. A system comprising: one or more processors; and one or more non-transitory computer-readable media storing instructions that, when executed by the one or more processors, cause the system to perform operations comprising: receiving log data representing a real environment in which a real vehicle was operating during a period of time; generating, using the log data, a simulated scenario for testing an autonomous vehicle controller, the simulated scenario including a simulated environment representing at least a portion of the real environment; causing, by the autonomous vehicle controller, a simulated autonomous vehicle to traverse the simulated environment, wherein the simulated autonomous vehicle's path in the simulated environment deviates from the real vehicle's path in the real environment; determining a simulation location of the simulated autonomous vehicle in the simulated environment; determining, based at least in part on the log data, a first time during the period of time in which a real location of the real vehicle in the real environment corresponded closest with the simulated location of the deviated simulated autonomous vehicle in the simulated environment; obtaining, from the log data, object data representing a real object in the real environment that was perceived by the real vehicle at the first time; and generating, in the simulated environment, a simulated object representing the real object.

B. The system as recited in paragraph A, wherein the simulated location comprises a first simulated location and the real location comprises a first real location, the operations further comprising: determining a second simulated location of the simulated autonomous vehicle in the simulated environment, the second simulated location different from the first simulated location; determining, based at least in part on the log data, a second time during the period of time in which a second real location of the real vehicle in the real environment corresponded closest with the second simulated location of the deviated simulated autonomous vehicle in the simulated environment; and at least one of: updating the simulated object to correspond with the real object in the real environment as perceived by the real vehicle at the second time; or generating, in the simulated environment, a second simulated object representing a second real object in the real environment that was perceived by the real vehicle at the second time.

C. The system as recited in any one of paragraphs A or B, wherein the simulated object comprises a first simulated object, the operations further comprising refraining from generating, in the simulated environment and based at least in part on at least one of the simulated location of the simulated autonomous vehicle or the first time, a second simulated object representing a second real object in the real environment that was perceived by the real vehicle at a second time after the first time.

D. The system as recited in any one of paragraphs A-C, the operations further comprising: determining whether the object data representing the real object is associated with a static object or a dynamic object; and wherein generating the simulated object representing the real object is based at least in part on determining that the object data is associated with a static object.

E. The system as recited in any one of paragraphs A-D, wherein a simulated pose of the simulated autonomous vehicle in the simulated environment deviates from a real pose of the real vehicle in the real environment.

F. A method comprising: receiving log data representing a first environment in which a first vehicle was operating;

generating, using the log data, a simulated environment for testing a vehicle controller, the simulated environment representing the real first environment; determining a position of a second vehicle as it traverses the simulated environment, the second vehicle controlled by the vehicle controller, wherein the second vehicle's path in the simulated environment deviates from the first vehicle's path in the first environment; determining, based at least in part on the log data, a location of the first vehicle in the first environment that is associated with the position of the deviated second vehicle in the simulated environment; and generating, in the simulated environment, a simulated object representing a first object in the first environment that was perceived by the first vehicle from the location.

G. The method as recited in paragraph F, further comprising: determining that the second vehicle has changed position in the simulated environment; and updating the simulated environment to include another simulated object representing a second object in the first environment that was perceived by the first vehicle from a second location that is associated with the changed position of the second vehicle.

H. The method as recited in any one of paragraphs F or G, wherein the log data is associated with a period of time in which the first vehicle was operating in the first environment, the method further comprising: determining, based at least in part on the log data, a first time during the period of time in which the first vehicle was positioned at the location; and obtaining, from the log data, object data representing the first object in the first environment as perceived by the first vehicle at the first time, wherein the simulated object is generated based at least in part on the object data.

I. The method as recited in any one of paragraphs F-H, wherein determining the location of the first vehicle comprises determining the location of the first vehicle in the first environment corresponding closest to the position of the second vehicle in the simulated environment.

J. The method as recited in any one of paragraphs F-I, further comprising: updating simulation instructions to include the simulated environment; and inputting the simulation instructions into the vehicle controller such that the vehicle controller controls the second vehicle to traverse the simulated environment.

K. The method as recited in any one of paragraphs F-J, wherein the log data comprises either simulated sensor data or actual sensor data captured by a sensor of the first vehicle.

L. The method as recited in any one of paragraphs F-K, further comprising controlling, by the vehicle controller, the second vehicle based at least in part on perceiving the simulated object.

M. The method as recited in any one of paragraphs F-L, further comprising: receiving an input indicating a user-specified location at which another simulated object is to be included within in the simulated environment; and generating, in the simulated environment, the other simulated object at the user-specified location.

N. The method as recited in any one of paragraphs F-M, wherein the log data comprises multiple instances of log data representing the first environment in which the first vehicle or a third vehicle was operating during multiple periods of time, and wherein determining the position of the second vehicle is based at least in part on the multiple instances of the log data.

O. The method as recited in any one of paragraphs F-N, further comprising determining whether the first object in the first environment is a static object or a dynamic object, and wherein generating the simulated object in the simulated environment is based at least in part on determining that the first object is a static object P. One or more non-transitory computer-readable media storing computer-executable instructions that, when executed, cause one or more processors to perform operations comprising: receiving log data representing a first environment in which a first vehicle is operating; generating, using the log data, a simulated environment for testing a vehicle controller, the simulated environment representing the first environment; determining a position of a second vehicle as it traverses the simulated environment, the second vehicle controlled by the vehicle controller, wherein the second vehicle's pose in the simulated environment deviates from the first vehicle's pose in the first environment; determining, based at least in part on the log data, a location of the first vehicle in the first environment that is associated with the position of the deviated second vehicle in the simulated environment; and generating, in the simulated environment, a simulated object representing a first object in the first environment that was perceived by the first vehicle from the location.

Q. The one or more non-transitory computer-readable media as recited in paragraph P, the operations further comprising: determining that the second vehicle has changed position in the simulated environment; and updating the simulated environment to include another simulated object representing a second object in the first environment that was perceived by the first vehicle from a second location that is associated with the changed position of the first vehicle.

R. The one or more non-transitory computer-readable media as recited in any one of paragraphs P or Q, wherein the log data is associated with a period of time in which the first vehicle was operating in the first environment, the operations further comprising: determining, based at least in part on the log data, a first time during the period of time in which the first vehicle was positioned at the location; and obtaining, from the log data, object data representing the first object in the first environment as perceived by the first vehicle at the first time.

S. The one or more non-transitory computer-readable media as recited in any one of paragraphs P-R, wherein determining the location of the first vehicle comprises determining the location of the first vehicle in the first environment corresponding closest to the position of the second vehicle in the simulated environment.

T. The one or more non-transitory computer-readable media as recited in any one of paragraphs P-S, the operations further comprising: receiving an input indicating a user-specified location at which another simulated object is to be generated within in the simulated environment; and generating, in the simulated environment, the other simulated object at the user-specified location.

U. A method comprising: receiving multiple log data files representing a real environment in which a real vehicle was operating during a period of time, the multiple log data files representing different objects in the real environment that were perceived by the real vehicle from different locations along a path traversed by the real vehicle and at different instances of time during the period of time in which the vehicle was traversing the path; presenting, to a vehicle controller, a first log data file of the multiple log data files to simulate a scenario for testing the vehicle controller, the first log data file representing an object in the real environment that was perceived by the real vehicle from a first location along the path at which the real vehicle was located at a first instance of time; causing, by the vehicle controller and based at least in part on the first log data file, a simulated vehicle to traverse a simulated environment representing the real environment; determining that the vehicle controller has caused the simulated vehicle to move from a first position in the simulated environment to a second position in the simulated environment, the first position corresponding with the first location; determining that the second position deviates from the path traversed by the real vehicle; based at least in part on determining that the second position deviated from the path, determining a second location along the path at which the real vehicle was located at a second instance of time, the second location corresponding closest to the second position; identifying a second log data file of the multiple log data files, the second log data file representing the object in the real environment that was perceived by the real vehicle from the second location along the path at which the real vehicle was located at the second instance of time; and presenting, to the vehicle controller, the second log data file.

While the example clauses described above are described with respect to one particular implementation, it should be understood that, in the context of this document, the content of the example clauses may also be implemented via a method, device, system, computer-readable medium, and/or another implementation. Additionally, any of examples A-U may be implemented alone or in combination with any other one or more of the examples A-U.

CONCLUSION

While one or more examples of the techniques described herein have been described, various alterations, additions, permutations and equivalents thereof are included within the scope of the techniques described herein.

In the description of examples, reference is made to the accompanying drawings that form a part hereof, which show by way of illustration specific examples of the claimed subject matter. It is to be understood that other examples may be used and that changes or alterations, such as structural changes, may be made. Such examples, changes or alterations are not necessarily departures from the scope with respect to the intended claimed subject matter. While the steps herein may be presented in a certain order, in some cases the ordering may be changed so that certain inputs are provided at different times or in a different order without changing the function of the systems and methods described. The disclosed procedures could also be executed in different orders. Additionally, various computations that are herein need not be performed in the order disclosed, and other examples using alternative orderings of the computations could be readily implemented. In addition to being reordered, the computations could also be decomposed into sub-computations with the same results.

What is claimed is:

1. A system comprising:
one or more processors; and
one or more non-transitory computer-readable media storing instructions that, when executed by the one or more processors, cause the system to perform operations comprising:
receiving log data representing a real environment in which a real vehicle was operating during a period of time, wherein the log data comprises:
a plurality of real timestamps along a real timeline;
first data describing the real environment at the plurality of real timestamps; and
second data describing the real vehicle at the plurality of real timestamps;
generating, using the log data, a simulated scenario for testing an autonomous vehicle controller, the simulated scenario including a simulated environment representing at least a portion of the real environment and a simulated timeline in the simulated scenario;
causing, by the autonomous vehicle controller, a simulated autonomous vehicle to traverse the simulated environment, wherein a simulated path of the simulated autonomous vehicle in the simulated environment deviates, as a deviated simulated path, from a real path traversed by the real vehicle in the real environment;
generating, based at least on the simulated timeline, a state of the simulated environment, wherein the state of the simulated environment comprises a representation of a portion of the simulated environment at a time associated with the state and the portion of the simulated environment is based at least on the simulated autonomous vehicle at the time associated with the state;
determining, based at least on the deviated simulated path, a simulated location of the simulated autonomous vehicle in the simulated environment at a simulation timestamp, wherein the simulation timestamp indicates a time along the simulated timeline corresponding to the time associated with the state of the simulated environment;
determining, based at least in part on the simulated location and the log data, a real location of the real vehicle in the real environment which corresponds closest with the simulated location of the simulated autonomous vehicle in the simulated environment, wherein the real location of the real vehicle is different from the simulated location based at least on the deviated simulated path deviating from the real path;
determining, based at least on the log data and the real location, a respective timestamp of the plurality of real timestamps indicating a time along the real timeline associated with the real location of the real vehicle, wherein the time indicated by the simulation timestamp along the simulated timeline is different than the time indicated by the respective timestamp along the real timeline;
obtaining, from the log data, object data representing a real object in the real environment that was perceived by the real vehicle at the respective timestamp; and
updating, in the simulated environment, at the simulation timestamp, and based at least on the object data, a simulated object representing the real object at the respective timestamp.

2. The system of claim 1, wherein the simulated location comprises a first simulated location and the real location comprises a first real location, the operations further comprising:
determining a second simulated location of the simulated autonomous vehicle in the simulated environment, the second simulated location different from the first simulated location;
determining, based at least on the log data, a second time during the period of time in which a second real location of the real vehicle in the real environment corresponded closest with the second simulated location of the simulated autonomous vehicle in the simulated environment; and at least one of:
  updating the simulated object to correspond with the real object in the real environment as perceived by the real vehicle at the second time; or
  generating, in the simulated environment, a second simulated object representing a second real object in the real environment that was perceived by the real vehicle at the second time.

3. The system of claim 1, wherein the simulated object comprises a first simulated object, the operations further comprising refraining from generating, in the simulated environment and based at least on at least one of the simulated location of the simulated autonomous vehicle or the respective timestamp, a second simulated object representing a second real object in the real environment that was perceived by the real vehicle at a second time after the respective timestamp.

4. The system of claim 1, the operations further comprising:
  determining whether the object data representing the real object is associated with a static object or a dynamic object; and
  wherein generating the simulated object representing the real object is based at least on determining that the object data is associated with the static object.

5. The system of claim 1, wherein a simulated pose of the simulated autonomous vehicle in the simulated environment deviates from a real pose of the real vehicle in the real environment.

6. A method comprising:
  receiving log data representing a first environment in which a first vehicle was operating the first vehicle traversing a first path in the first environment, wherein the log data comprises a plurality of respective timestamps along a real timeline and data describing the first path at the plurality of respective timestamps;
  generating, using the log data, a simulated environment for testing a vehicle controller, the simulated environment comprising a simulated timeline and a representation of the first environment;
  determining a second path traversed by a second vehicle in the simulated environment, the second vehicle controlled by the vehicle controller, wherein the second path deviates from the first path in the first environment;
  determining, based at least on the second path, a position in the simulated environment of the second vehicle as it traverses the simulated environment, wherein the position of the second vehicle is associated with a simulated timestamp along the simulated timeline;
  determining, based at least on the log data, a location of the first vehicle in the first environment at a respective timestamp that corresponds closest with the position of the second vehicle in the simulated environment at the simulation timestamp, wherein:
    the location of the first vehicle at the respective timestamp is different than the position of the second vehicle associated with the simulated timestamp, and
    the simulation timestamp is different than the respective timestamp; and
  updating, in the simulated environment and at the simulation timestamp, a simulated object representing a first object in the first environment that was perceived by the first vehicle from the location at the respective timestamp.

7. The method of claim 6, further comprising:
  determining that the second vehicle has changed position in the simulated environment; and
  updating the simulated environment to include another simulated object representing a second object in the first environment that was perceived by the first vehicle from a second location that is associated with the changed position of the second vehicle.

8. The method of claim 6, wherein the log data is associated with a period of time in which the first vehicle was operating in the first environment, the method further comprising:
  determining, based at least on the log data, the respective timestamp during the period of time in which the first vehicle was positioned at the location; and
  obtaining, from the log data, object data representing the first object in the first environment as perceived by the first vehicle at the respective timestamp, wherein the simulated object is generated based at least on the object data.

9. The method of claim 6, wherein determining the location of the first vehicle comprises determining the location of the first vehicle in the first environment corresponding closest to the position of the second vehicle in the simulated environment.

10. The method of claim 6, further comprising:
  updating simulation instructions to include the simulated environment; and
  inputting the simulation instructions into the vehicle controller such that the vehicle controller controls the second vehicle to traverse the simulated environment.

11. The method of claim 6, wherein the log data comprises either simulated sensor data or actual sensor data captured by a sensor of the first vehicle.

12. The method of claim 6, further comprising controlling, by the vehicle controller, the second vehicle based at least on perceiving the simulated object.

13. The method of claim 6, further comprising:
  receiving an input indicating a user-specified location at which another simulated object is to be included within the simulated environment; and
  generating, in the simulated environment, the another simulated object at the user-specified location.

14. The method of claim 6, wherein the log data comprises multiple instances of log data representing the first environment in which the first vehicle or a third vehicle was operating during multiple periods of time, and wherein determining the position of the second vehicle is based at least on the multiple instances of the log data.

15. The method of claim 6, further comprising determining whether the first object in the first environment is a static object or a dynamic object, and wherein generating the simulated object in the simulated environment is based at least on determining that the first object is the static object.

16. One or more non-transitory computer-readable media storing computer-executable instructions that, when executed, cause one or more processors to perform operations comprising:
  receiving log data representing a first environment in which a first vehicle was operating, wherein the log data comprises a plurality of respective timestamps along a real timeline and data describing the first vehicle in the first environment;

generating, using the log data, a simulated environment for testing a vehicle controller, the simulated environment comprising a simulated timeline and a representation of the first environment;

determining a second path traversed by a second vehicle in the simulated environment, the second vehicle controlled by the vehicle controller, wherein the second path deviates from the first path in the first environment;

determining, based at least on the second path, a position in the simulated environment, of the second vehicle as it traverses the simulated environment, wherein the position of the second vehicle is associated with a simulation timestamp along the simulated timeline;

determining, based at least on the log data, a location of the first vehicle in the first environment at a respective timestamp that corresponds closest with the position of the second vehicle in the simulated environment at the simulation timestamp, wherein:

the location of the first vehicle at the respective timestamp is different than the position of the second vehicle associated with the simulated timestamp, and the simulation timestamp is different than the respective timestamp; and updating, in the simulated environment and at the simulation timestamp, a simulated object representing a first object in the first environment that was perceived by the first vehicle from the location at the respective timestamp.

17. The one or more non-transitory computer-readable media of claim 16, the operations further comprising:

determining that the second vehicle has changed position in the simulated environment; and updating the simulated environment to include another simulated object representing a second object in the first environment that was perceived by the first vehicle from a second location that is associated with the changed position of the first vehicle.

18. The one or more non-transitory computer-readable media of claim 16, wherein the log data is associated with a period of time in which the first vehicle was operating in the first environment, the operations further comprising:

determining, based at least on the log data, the respective timestamp during the period of time in which the first vehicle was positioned at the location; and obtaining, from the log data, object data representing the first object in the first environment as perceived by the first vehicle at the respective timestamp.

19. The one or more non-transitory computer-readable media of claim 16, wherein determining the location of the first vehicle comprises determining the location of the first vehicle in the first environment corresponding closest to the position of the second vehicle in the simulated environment.

20. The one or more non-transitory computer-readable media of claim 16, the operations further comprising:

receiving an input indicating a user-specified location at which another simulated object is to be generated within the simulated environment; and generating, in the simulated environment, the another simulated object at the user-specified location.

* * * * *